(12) United States Patent
Takazawa

(10) Patent No.: US 10,607,942 B2
(45) Date of Patent: Mar. 31, 2020

(54) SEMICONDUCTOR DEVICE AND METHOD FOR MANUFACTURING SEMICONDUCTOR DEVICE

(71) Applicant: OLYMPUS CORPORATION, Hachioji-shi, Tokyo (JP)

(72) Inventor: Naohiro Takazawa, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/114,566

(22) Filed: Aug. 28, 2018

(65) Prior Publication Data

US 2018/0366414 A1    Dec. 20, 2018

Related U.S. Application Data

(63) Continuation of application No. PCT/JP2016/061900, filed on Apr. 13, 2016.

(51) Int. Cl.
| | |
|---|---|
| *H01L 21/00* | (2006.01) |
| *H01L 23/544* | (2006.01) |
| *H01L 23/00* | (2006.01) |

(52) U.S. Cl.
CPC ............ *H01L 23/544* (2013.01); *H01L 24/03* (2013.01); *H01L 24/09* (2013.01); *H01L 24/48* (2013.01); *H01L 2223/54426* (2013.01)

(58) Field of Classification Search
CPC ....... H01L 23/544; H01L 24/03; H01L 24/09; H01L 24/48
See application file for complete search history.

(56) References Cited

U.S. PATENT DOCUMENTS 4,907,039 A * 3/1990 Chikaki ............... H01L 23/544
257/734
5,051,807 A * 9/1991 Morozumi ........... H01L 23/544
257/369
(Continued)

FOREIGN PATENT DOCUMENTS

| JP | H04-239736 A | 8/1992 |
| JP | 6-232205 A | 8/1994 |

(Continued)

OTHER PUBLICATIONS

International Search Report dated Jul. 19, 2016, issued in counterpart International Application No. PCT/JP2016/061900 (2 pages, including English translation and Japanese original).

(Continued)

*Primary Examiner* — Richard A Booth
(74) *Attorney, Agent, or Firm* — Westerman, Hattori, Daniels & Adrian, LLP

(57) ABSTRACT

A semiconductor device includes a first semiconductor layer, a second semiconductor layer, a first pad, and a second pad. A first opening and a second opening are formed in a first main surface of the first semiconductor layer. The second semiconductor layer is stacked on the first semiconductor layer. The first pad for wire bonding is disposed in the first opening. The second pad on which an alignment mark is formed is disposed in the second opening. A third opening and a fourth opening penetrate the second semiconductor layer. The first opening overlaps the third opening. The second opening overlaps the fourth opening.

5 Claims, 20 Drawing Sheets

(56) References Cited

U.S. PATENT DOCUMENTS

| | | | | |
|---|---|---|---|---|
| 5,401,691 A | * | 3/1995 | Caldwell | H01L 23/544 |
| | | | | 257/E23.179 |
| 5,496,777 A | * | 3/1996 | Moriyama | G03F 9/7076 |
| | | | | 438/703 |
| 5,814,552 A | * | 9/1998 | Lu | H01L 21/82389 |
| | | | | 148/DIG. 102 |
| 2014/0103522 A1 | | 4/2014 | Takemoto | |

FOREIGN PATENT DOCUMENTS

| | | |
|---|---|---|
| JP | 7-130787 A | 5/1995 |
| JP | 2001-326241 A | 11/2001 |
| JP | 5065889 B2 | 11/2012 |
| JP | 2014-82281 A | 5/2014 |
| JP | 2016-152299 A | 8/2016 |

OTHER PUBLICATIONS

Notice of Allowance dated Feb. 4, 2020, issued in counterpart JP Application No. 2018-511818, with English translation. (6 pages).

* cited by examiner

SEMICONDUCTOR DEVICE AND METHOD FOR MANUFACTURING SEMICONDUCTOR DEVICE

BACKGROUND OF THE INVENTION

Field of the Invention

The present invention relates to a semiconductor device and a method for manufacturing a semiconductor device.

This application is a continuation application based on International Patent Application No. PCT/JP 2016/061900, filed on Apr. 13, 2016, the content of which is incorporated herein by reference.

Description of Related Art

In general, when a semiconductor device is mounted on a circuit board, pads formed on the semiconductor device are wired to the circuit board by wire bonding. The positions of the pads are detected by image recognition using a camera. For example, Japanese Patent Publication No. 5065889 discloses an alignment method based on image recognition. On the other hand, as disclosed in Japanese Patent Application, First Publication No. H7-130787, dummy pads formed on a semiconductor device may be used as alignment marks.

FIG. 48 is a plan view of a monolithic semiconductor device 1010. The semiconductor device 1010 has a semiconductor layer 1200 on which a pad 1110 and a dummy pad 1120 are disposed. The surface of the semiconductor layer 1200 is covered with a thin insulating film. The insulating film is omitted in FIG. 48. Openings 1210 and 1220 are formed in the insulating film. The pad 1110 is exposed to the opening 1210 and the dummy pad 1120 is exposed to the opening 1220. The pad 1110 and the dummy pad 1120 are metallic thin films. Since the pad 1110 and the dummy pad 1120 are thin, the pad 1110 and the dummy pad 1120 are formed with high accuracy by photolithography and etching. Since the insulating film is thin, the openings 1210 and 1220 are formed with high accuracy by photolithography and etching. The centers of the pad 1110 and the opening 1210 are substantially identical. The centers of the dummy pad 1120 and the opening 1220 are substantially identical.

Since the insulating film is thin, the insulating film is substantially transparent. Due to this, an outline 1110A of the pad 1110 and an outline 1120A of the dummy pad 1120 can be perceived. In alignment of wire bonding positions, the center P110 of the dummy pad 1120 is detected by image recognition. After that, on the basis of a positional relationship in design between the center P110 of the dummy pad 1120 and the center of the pad 1110, the position P120 corresponding to the center of the pad 1110 is detected, and wire bonding is performed at the position P120. A plurality of pads 1110 are disposed in the semiconductor device 1010. In FIG. 48, only one pad 1110 is shown as a representative example, and the other pads 1110 are omitted. In order to perform alignment at a high speed, the position P120 corresponding to the center of each pad 1110 is calculated on the basis of the center P110 of one dummy pad 1120 detected by image recognition. Since the outline 1120A of the dummy pad 1120 can be perceived, the accuracy of detection of the center P110 of the dummy pad 1120 by image recognition is high. Due to this, the detection accuracy of the position P120 corresponding to the center of the pad 1110 is high. That is, the alignment accuracy of the wire bonding positions is high. Although an example of calculating the position P120 on the basis of the center P110 of one dummy pad 1120 is shown for the sake of convenience, the position P120 may be calculated on the basis of the centers P110 of two different dummy pads 1120.

FIG. 49 is a plan view of a stacked semiconductor device 1011 on which a plurality of semiconductor layers are stacked. The semiconductor device 1011 has a plurality of stacked semiconductor layers. Only a semiconductor layer 1201 among a plurality of semiconductor layers is shown in FIG. 49. Openings 1211 and 1221 are formed in the semiconductor layer 1201. A pad 1111 and a dummy pad 1121 are disposed in a wiring layer in a semiconductor layer (not shown) stacked in the semiconductor layer 1201. The pad 1111 is exposed to the opening 1211 and the dummy pad 1121 is exposed to the opening 1221. The pad 1111 and the dummy pad 1121 are metallic thin films. Since the pad 1111 and the dummy pad 1121 are thin, the pad 1111 and the dummy pad 1121 are formed with high accuracy by photolithography and etching.

Since the semiconductor layer 1201 is thick, an outline 1111A of the pad 1111 and an outline 1121A of the dummy pad 1121 cannot be perceived. In alignment of wire bonding positions, the center P111 of the opening 1221 is detected by image recognition. After that, on the basis of a positional relationship in design between the center of the dummy pad 1121 and the center of the pad 1111, the position P121 of the pad 1111 corresponding to the center P111 of the opening 1221 is detected and wire bonding is performed at the position P121. The position P121 is a position estimated as the center of the opening 1211. A plurality of pads 1111 are disposed in the semiconductor device 1011. In FIG. 49, only one pad 1111 is shown as a representative example, and the other pads 1111 are omitted. In order to perform alignment at a high speed, the position P121 corresponding to the center of each opening 1211 is calculated on the basis of the center P111 of one opening 1221 detected by image recognition. Although an example of calculating the position P121 on the basis of the center P111 of one opening 1221 is shown for the sake of convenience, the position P121 may be calculated on the basis of the centers P111 of two different openings 1221.

A resist film is formed on the semiconductor layer 1201 in a photolithography step for forming the openings 1211 and 1221. Since the semiconductor layer 1201 is thick, it takes a long time to etch the semiconductor layer 1201. The resist film is formed to be thick since the resist film is damaged during etching of the semiconductor layer 1201. Due to this, in a photolithography step, a focusing state of ultraviolet rays radiated to the resist film is likely to be different depending on the position in a thickness direction of the resist film. As a result, the position of an opening formed in the resist film is likely to deviate from a designed position. When the semiconductor layer 1201 is etched through the opening formed in the resist film, the openings 1211 and 1221 are formed. Since the position of the opening formed in the resist film is likely to deviate from a designed position, the positions of the openings 1211 and 1221 are likely to deviate from a designed position.

FIG. 50 shows an example in which the positions of the openings 1211 and 1221 deviate greatly from a designed position. Since the position of the opening 1221 deviates from the designed position, the opening 1221 is generally shifted in a direction Dr20. Due to this, the center P111 of the opening 1221 is shifted in the direction Dr20 from the center P112 of the dummy pad 1121. Since the position of the opening 1211 deviates from the designed position, the opening 1211 is generally shifted in a direction Dr21. Due to this, the center P122 of the opening 1211 is shifted in the direction Dr21 from the center P123 of the pad 1111. FIG. 50 shows an example in which the directions Dr20 and Dr21 are opposite directions.

Since the center P111 of the opening 1221 is shifted from the center P112 of the dummy pad 1121, the position P121 estimated as the center P122 of the opening 1211 is shifted from the center P123 of the pad 1111. As described above, the center P122 of the opening 1211 is shifted from the center P123 of the pad 1111. A distance D100 between the position P121 and the center P122 of the opening 1211 is based on a first distance and a second distance. The first distance is the distance between the position P121 and the center P123 of the pad 1111. The first distance is the same as the distance between the center P111 of the opening 1221 and the center P112 of the dummy pad 1121. The second distance is the distance between the center P123 of the pad 1111 and the center P122 of the opening 1211. When the directions Dr20 and Dr21 are opposite directions, the distance D100 is based on the sum of the first and second distance. When the directions Dr20 and Dr21 are opposite directions, the distance D100 is the largest.

When the positions of the openings 1211 and 1221 are the same as the designed positions, the position P121 is substantially the same as the center P122 of the opening 1211. As described above, when the positions of the openings 1211 and 1221 deviates greatly from the designed positions, the distance D100 between the position P121 and the center P122 of the opening 1211 is large.

SUMMARY OF THE INVENTION

According to a first aspect of the present invention, a semiconductor device includes a first semiconductor layer, a second semiconductor layer, a first pad, and a second pad. The first semiconductor layer has a first main surface. A first opening and a second opening are formed in the first main surface. The second semiconductor layer has a second main surface and is stacked on the first semiconductor layer. A third opening and a fourth opening are formed in the second semiconductor layer. The first pad has a third main surface for wire bonding. The third main surface is disposed in the first opening. The second pad has a fourth main surface on which an alignment mark is formed. The fourth main surface is disposed in the second opening. The second main surface faces the first main surface. The third opening and the fourth opening penetrate the second semiconductor layer in a thickness direction of the second semiconductor layer. The first opening overlaps the third opening. The second opening overlaps the fourth opening. A width of the first pad in a second direction perpendicular to a first direction is larger than a width of the first opening in the second direction. A width of the second pad in the second direction is larger than a width of the second opening in the second direction. The first direction is a thickness direction of the first semiconductor layer.

According to a second aspect of the present invention, in the first aspect, the first pad and the second pad may be formed of the same metal. The alignment mark may be a concave portion formed in the fourth main surface.

According to a third aspect of the present invention, in the first aspect, the first pad and the second pad may be formed of the same metal. The alignment mark may be a convex portion formed on the fourth main surface.

According to a fourth aspect of the present invention, in the first aspect, the first pad and the second pad may be formed of the same metal. The alignment mark may be a through-hole penetrating the second pad in the thickness direction.

According to a fifth aspect of the present invention, in the fourth aspect, the semiconductor device may further include a metal film. The second pad may be disposed between the second semiconductor layer and the metal film.

According to a sixth aspect of the present invention, a method for manufacturing a semiconductor device includes a first step, a second step, a third step, and a fourth step. The first step is a step of stacking a first semiconductor layer on a second semiconductor layer. The first semiconductor layer has a first main surface. The second semiconductor layer has a second main surface facing the first main surface. The second step is a step of forming a first pad and a second pad in the first semiconductor layer. The first pad has a third main surface for wire bonding. The second pad has a fourth main surface on which an alignment mark is formed. The third step is a step of forming a third opening and a fourth opening in the second semiconductor layer. The third opening and the fourth opening penetrate the second semiconductor layer in a thickness direction of the second semiconductor layer. The fourth step is a step of forming a first opening and a second opening in the first main surface. The first opening overlaps the third opening. The second opening overlaps the fourth opening. The third main surface is disposed in the first opening. The fourth main surface is disposed in the second opening According to a seventh aspect of the present invention, in the sixth aspect, the method for forming the semiconductor device may further include a fifth step of forming a metal film in the first semiconductor layer. The first pad and the second pad may be formed of the same metal. The alignment mark may be a through-hole formed in the second pad. The second pad may be disposed between the second semiconductor layer and the metal film.

DETAILED DESCRIPTION OF THE INVENTION

Embodiments of the present invention will be described with reference to the drawings.

First Embodiment

Figure 1:
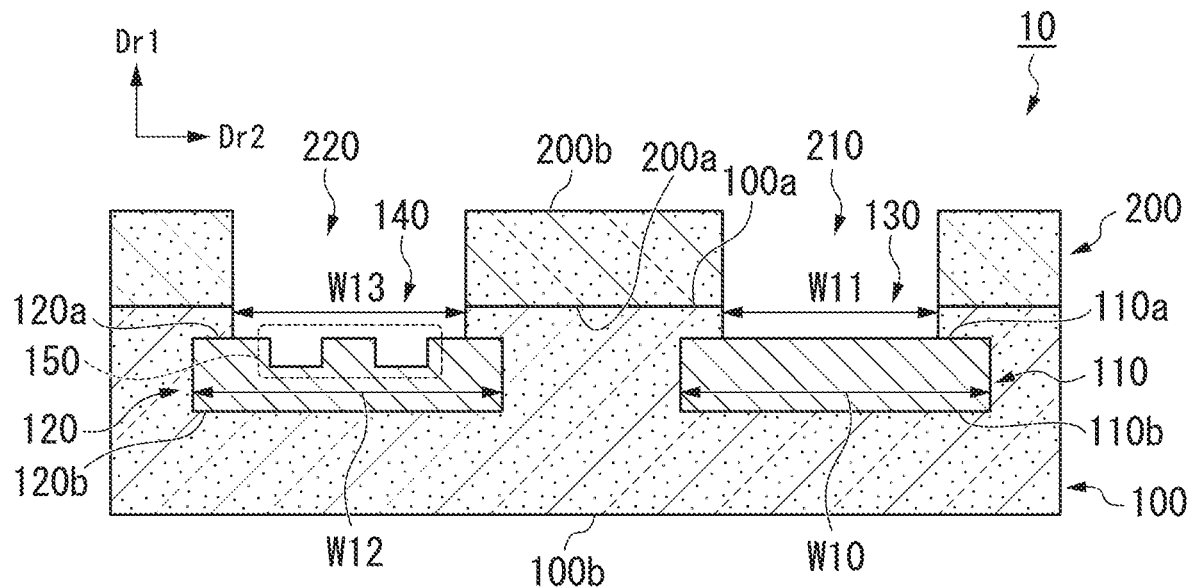
FIG. 1 is a cross-sectional view of a semiconductor device according to a first embodiment of the present invention.

FIG. 1 shows a configuration of a semiconductor device 10 according to a first embodiment of the present invention. The semiconductor device 10 is a stacked semiconductor device. The stacked semiconductor device may be a backside illumination imaging device. FIG. 1 shows a cross-section of the semiconductor device 10.

Dimensions of components that form the semiconductor device 10 need not always conform to the dimensions shown in FIG. 1. The dimensions of the components that form the semiconductor device 10 are arbitrary. The same applies to dimensions in cross-sectional views other than FIG. 1.

As shown in FIG. 1, the semiconductor device 10 includes a first semiconductor layer 100, a second semiconductor layer 200, a first pad 110, and a second pad 120. The first semiconductor layer 100 and the second semiconductor layer 200 are stacked in a thickness direction Dr1 of the first semiconductor layer 100. The thickness direction Dr1 of the first semiconductor layer 100 is a direction perpendicular to a surface 100a of the first semiconductor layer 100. The first semiconductor layer 100 and the second semiconductor layer 200 are in contact with each other.

For example, the thickness of the first semiconductor layer 100 is between 2 μm and 10 μm, and the thickness of the second semiconductor layer 200 is 700 μm. When the first semiconductor layer 100 includes a supporting substrate, the thickness of the first semiconductor layer 100 is 700 μm, and the thickness of the second semiconductor layer 200 is 3 μm. The thicknesses of the first and second semiconductor layers 100 and 200 are not limited to these numerical values.

The first semiconductor layer 100 is formed of a semiconductor material. For example, the semiconductor material that forms the first semiconductor layer 100 is at least one of silicon (Si), germanium (Ge), gallium (Ga), and arsenic (As). The first semiconductor layer 100 may include a wiring layer. Therefore, the first semiconductor layer 100 may be formed of an insulating material and a conductive material in addition to the semiconductor material. For example, the insulating material that forms the first semiconductor layer 100 is silicon oxide ($SiO_2$). For example, the conductive material that forms the first semiconductor layer 100 may be a metal such as aluminum (Al) or copper (Cu). The first semiconductor layer 100 has a surface 100a and a surface 100b. The surfaces 100a and 100b are main surfaces of the first semiconductor layer 100. The main surfaces of the first semiconductor layer 100 are relatively large surfaces among the plurality of surfaces that form the surfaces of the first semiconductor layer 100. The surfaces 100a and 100b face in opposite directions. A first opening 130 and a second opening 140 are disposed in the surface 100a. The first opening 130 and the second opening 140 are concave portions formed in the surface 100a. The first opening 130 and the second opening 140 are formed as side walls connected to the surface 100a.

The first pad 110 and the second pad 120 are formed of a conductive material. For example, the conductive material that forms the first and second pads 110 and 120 may be a metal such as aluminum (Al) or gold (Au). For example, the first and second pads 110 and 120 may be formed of the same metal. The first and second pads 110 and 120 may be formed of different metals. For example, the thicknesses of the first and second pads 110 and 120 are between 0.4 μm and 0.5 μm. A plurality of first pads 110 may be disposed in the first semiconductor layer 100. A plurality of second pads 120 may be disposed in the first semiconductor layer 100.

The first pad 110 has a surface 110a and a surface 110b. The surfaces 110a and 110b are main surfaces of the first pad 110. The main surfaces of the first pad 110 are relatively large surfaces among the plurality of surfaces that form the surfaces of the first pad 110. The surfaces 110a and 110b face in opposite directions. Wires are connected to the surface 110a by wire bonding. In the first semiconductor layer 100, the first opening 130 is formed between the surface 100a and the first pad 110. The surface 110a is disposed in the first opening 130. The surface 110a is exposed in the first opening 130. A width W10 of the first pad 110 is larger than a width W11 of the first opening 130. The widths W10 and W11 are widths in the direction Dr2 perpendicular to the thickness direction Dr1 of the first semiconductor layer 100.

The second pad 120 has a surface 120a and a surface 120b. The surfaces 120a and 120b are main surfaces of the second pad 120. The main surfaces of the second pad 120 are relatively large surfaces among the plurality of surfaces that form the surfaces of the second pad 120. The surfaces 120a and 120b face in opposite directions. In the first semiconductor layer 100, the second opening 140 is formed between the surface 100a and the second pad 120. The surface 120a is disposed in the second opening 140. The surface 120a is exposed in the second opening 140. The alignment mark 150 is disposed in the surface 120a. A concave portion formed in the surface 120a forms the alignment mark 150. The alignment mark 150 is disposed in a region of the surface 120a overlapping the second opening 140. A width W12 of the second pad 120 is larger than a width W13 of the second opening 140. The widths W12 and W13 are widths in the direction Dr2 perpendicular to the thickness direction Dr1 of the first semiconductor layer 100. The second pad 120 is electrically insulated from the first pad 110. The second pad 120 functions as a dummy pad.

For example, the surfaces 110a and 120a are disposed in the same plane. Similarly, the surfaces 110b and 120b are disposed in the same plane. For example, a size of a first step between the surface 100a and the surface 110a and a size of a second step between the surface 100a and the surface 120a are 500 nm. The size of the first step may be different from the size of the second step. For example, a difference between the size of the first step and the size of the second step is 1 μm or smaller.

The second semiconductor layer 200 is formed of a semiconductor material. For example, the semiconductor material that forms the second semiconductor layer 200 is at least one of silicon (Si), germanium (Ge), gallium (Ga), and arsenic (As). The second semiconductor layer 200 has a surface 200a and a surface 200b. The surfaces 200a and 200b are main surfaces of the second semiconductor layer 200. The main surfaces of the second semiconductor layer 200 are relatively large surfaces among the plurality of surfaces that form the surfaces of the second semiconductor layer 200. The surfaces 200a and 200b face in opposite directions. The surface 200a faces the surface 100a and is in contact with the surface 100a. The third opening 210 and the fourth opening 220 are disposed in the surface 200a and the surface 200b, respectively. The third opening 210 and the fourth opening 220 are through-holes formed in the second semiconductor layer 200. The third opening 210 and the fourth opening 220 are configured as side walls connected to the surface 200a and the surface 200b, respectively. The first opening 130 overlaps the third opening 210. The second opening 140 overlaps the fourth opening 220. The alignment mark 150 overlaps the second opening 140 and the fourth opening 220.

The first semiconductor layer 100 and the second semiconductor layer 200 may have a circuit component such as a transistor. The first semiconductor layer 100 and the second semiconductor layer 200 may have a plurality of stacked layers. The first semiconductor layer 100 and the second semiconductor layer 200 may have one or a plurality of layers of wirings. The semiconductor device 10 may have three or more semiconductor layers. For example, a third semiconductor layer may be stacked on the surface 100b of the first semiconductor layer 100.

Figure 2:
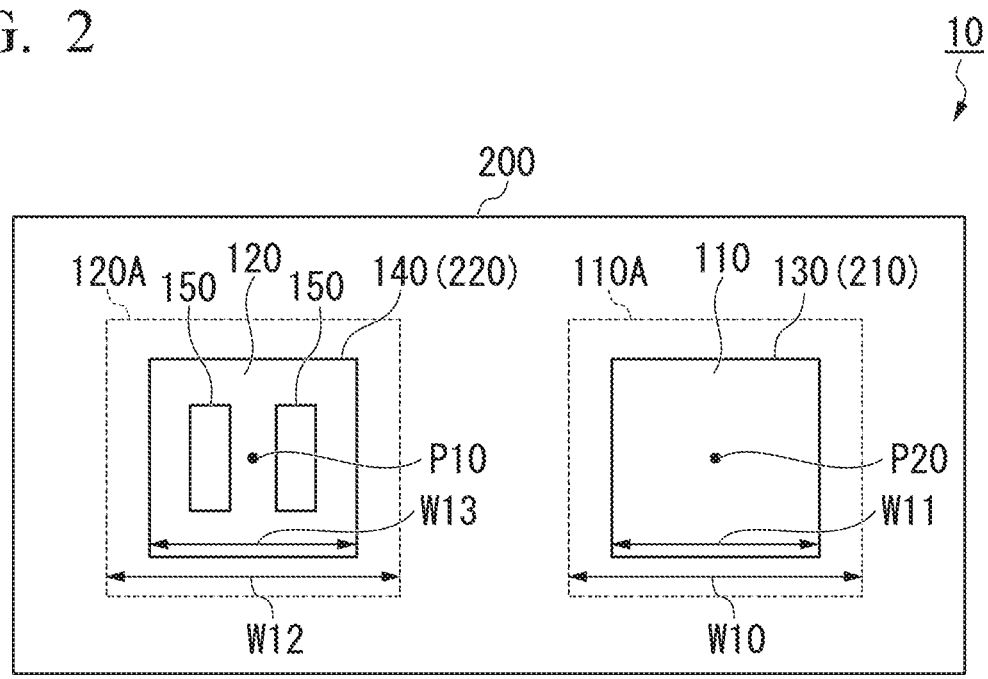
FIG. 2 is a plan view of the semiconductor device according to the first embodiment of the present invention.

FIG. 2 is a plan view of the semiconductor device 10. In FIG. 2, an arrangement of respective components when the second semiconductor layer 200 is seen in a direction perpendicular to the surface 200b is shown. That is, in FIG. 2, an arrangement of respective components when the second semiconductor layer 200 is seen from the front of the second semiconductor layer 200 is shown.

The first pad 110, the second pad 120, the first opening 130, the second opening 140, the third opening 210, and the fourth opening 220 have a rectangular shape. These components may have shapes other than a rectangular shape. The first opening 130 overlaps the third opening 210. The second opening 140 overlaps the fourth opening 220. The first pad 110 overlaps the first opening 130. The width W10 of the first pad 110 is larger than the width W11 of the first opening 130. Therefore, an area of the first pad 110 is larger than an area of the first opening 130. The second pad 120 overlaps the second opening 140. The width W12 of the second pad 120 is larger than the width W13 of the second opening 140. Therefore, an area of the second pad 120 is larger than an area of the second opening 140. Two narrow rectangles form the alignment mark 150. The direction of the long side of the rectangle that forms the alignment mark 150 is a vertical direction in FIG. 2. Since the first and second pads 110 and 120 are thin, the first and second pads 110 and 120 can be formed with high accuracy by photolithography and etching.

Since the second semiconductor layer 200 is thick, an outline 110A of the first pad 110 and an outline 120A of the second pad 120 cannot be perceived. However, since the alignment mark 150 is disposed, a center P10 of the second pad 120 is easily detected by image recognition in alignment of wire bonding positions. On the basis of a positional relationship in design between the center P10 of the second pad 120 and the center of the first pad 110, a position P20 of the first pad 110 corresponding to the center P10 of the second pad 120 is detected and wire bonding is performed at the position P20. The position P20 is a position estimated as the center of the first pad 110. When a plurality of first pads 110 are disposed in the semiconductor device 10, in order to perform alignment at a high speed, the position P20 corresponding to the center of each of the first pads 110 is calculated on the basis of the center P10 of one second pad 120 detected by image recognition. Although an example of calculating the position P20 on the basis of the center P10 of one second pad 120 is shown for the sake of convenience, the position P20 may be calculated on the basis of the centers P10 of two different second pads 120.

In a photolithography step for forming an opening in the first and second semiconductor layers 100 and 200, a resist film is formed on the second semiconductor layer 200. Since the second semiconductor layer 200 is thick, it takes a long time to etch the second semiconductor layer 200. The resist film is formed to be thick since the resist film is damaged during etching of the second semiconductor layer 200. Due to this, in a photolithography step, a focusing state of ultraviolet rays radiated to the resist film is likely to be different depending on the position in a thickness direction of the resist film. As a result, the position of an opening formed in the resist film is likely to deviate greatly from a designed position. The first and second semiconductor layers 100 and 200 are etched through an opening formed in the resist film whereby the first, second, third, and fourth openings 130, 140, 210, and 220 are formed. Since the position of the opening formed in the resist film is likely to deviate from a designed position, the position of the opening formed in the first and second semiconductor layers 100 and 200 is likely to deviate from a designed position.

Figure 3:
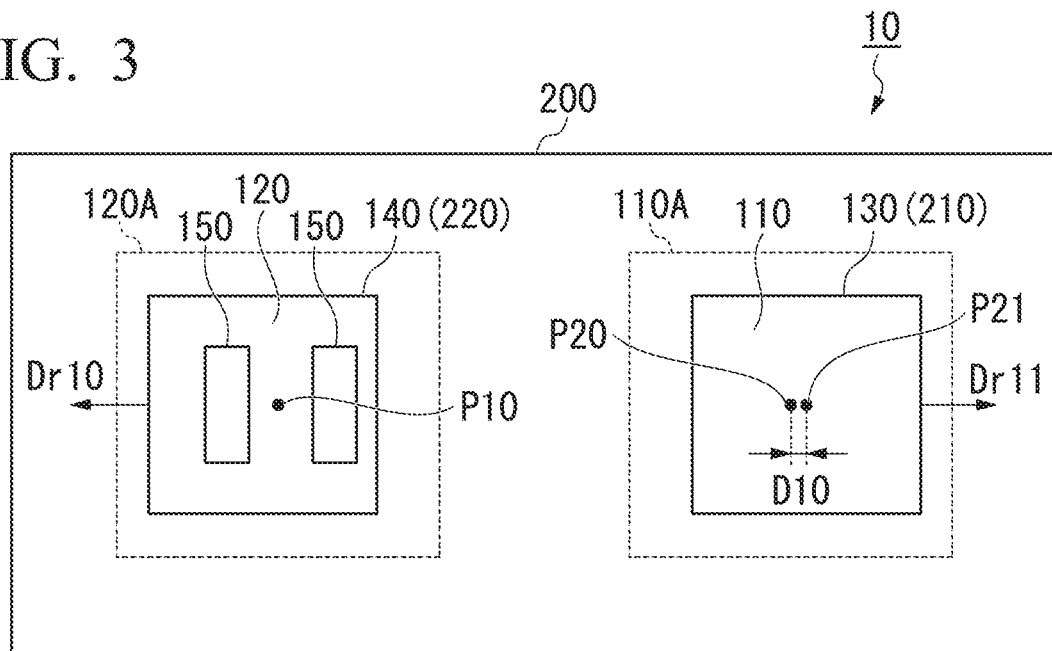
FIG. 3 is a plan view of the semiconductor device according to the first embodiment of the present invention.

Hereinafter, a case in which the dimensions of the first opening 130 are the same as the dimensions of the third opening 210 and the dimensions of the second opening 140 are the same as the dimensions of the fourth opening 220 will be described. FIG. 3 shows an example in which the positions of the first and second openings 130 and 140 deviate greatly from a designed position. Since the position of the second opening 140 deviates from the designed position, the second opening 140 is generally shifted in the direction Dr10. Since the position of the first opening 130 deviates from the designed position, the first opening 130 is generally shifted in the direction Dr11. FIG. 3 shows an example in which the directions Dr10 and Dr11 are opposite directions.

As described above, the position P20 is based on a positional relationship in design between the center P10 of the second pad 120 and the center of the first pad 110. Since the position P20 is detected on the basis of the center P10 of the second pad 120, the position P20 is substantially the same as the center of the first pad 110. The center P21 of the first opening 130 is shifted in the direction Dr11 from the center of the first pad 110. The distance D10 between the position P20 and the center P21 of the first opening 130 is based on the distance between the center of the first pad 110 and the center P21 of the first opening 130. The position P20 does not depend on a shift between the position of the second opening 140 and the designed position.

Figure 50:
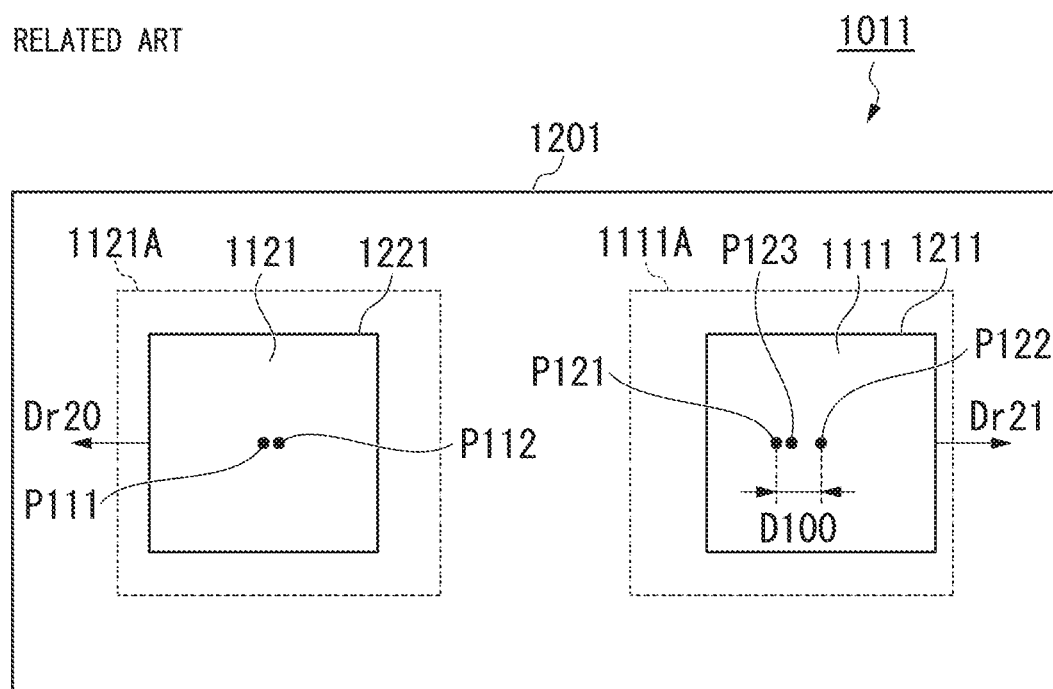
FIG. 50 is a plan view of the conventional stacked semiconductor device.

A shift amount of the second opening 140 with respect to the second pad 120 in FIG. 3 is the same as a shift amount of the opening 1221 with respect to the dummy pad 1121 in FIG. 50. A shift amount of the first opening 130 with respect to the first pad 110 in FIG. 3 is the same as a shift amount of the opening 1211 with respect to the pad 1111 in FIG. 50. The center P10 of the second pad 120 in FIG. 3 corresponds to the center P112 of the dummy pad 1121 in FIG. 50. The position P20 in FIG. 3 corresponds to the center P123 of the pad 1111 in FIG. 50. The center P21 of the first opening 130 in FIG. 3 corresponds to the center P122 of the opening 1211 in FIG. 50. The distance D10 in FIG. 3 corresponds to the distance between the center P122 of the opening 1211 and the center P123 of the pad 1111 in FIG. 50. The distance D10 in FIG. 3 is smaller than the distance D100 in FIG. 50.

As described above, even when the positions of the first and second openings 130 and 140 deviate greatly from the designed positions, the distance D10 between the position P20 and the center P21 of the first opening 130 is restricted to being small. Due to this, when wire bonding is performed at the position P20 of the first pad 110, a ball portion of a wire does not easily make contact with the side wall of the first opening 130 or the third opening 210. Alternatively, a ball portion of a wire does not easily make contact with the surface 200b of the second semiconductor layer 200 at the periphery of the third opening 210. That is, the alignment accuracy of wire bonding positions is improved. As a result, electrical and mechanical reliability of the semiconductor device 10 is improved.

In FIG. 50, when the directions Dr20 and Dr21 are opposite directions, the distance D100 is the largest. When the dimensional conditions in FIGS. 3 and 50 are the same, the distance D10 in FIG. 3 is always smaller than the distance D100 regardless of the directions Dr10 and Dr11. Therefore, a worst case in the alignment accuracy of the wire bonding position is avoided.

Figure 4:
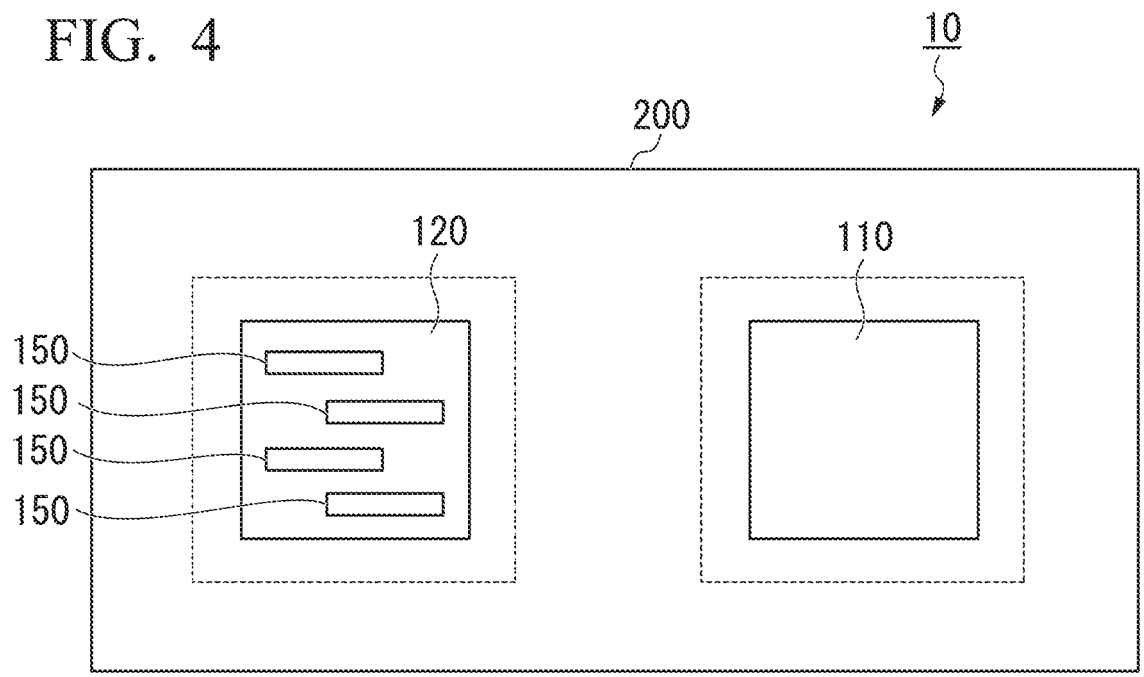
FIG. 4 is a plan view of the semiconductor device according to the first embodiment of the present invention.
Figure 5:
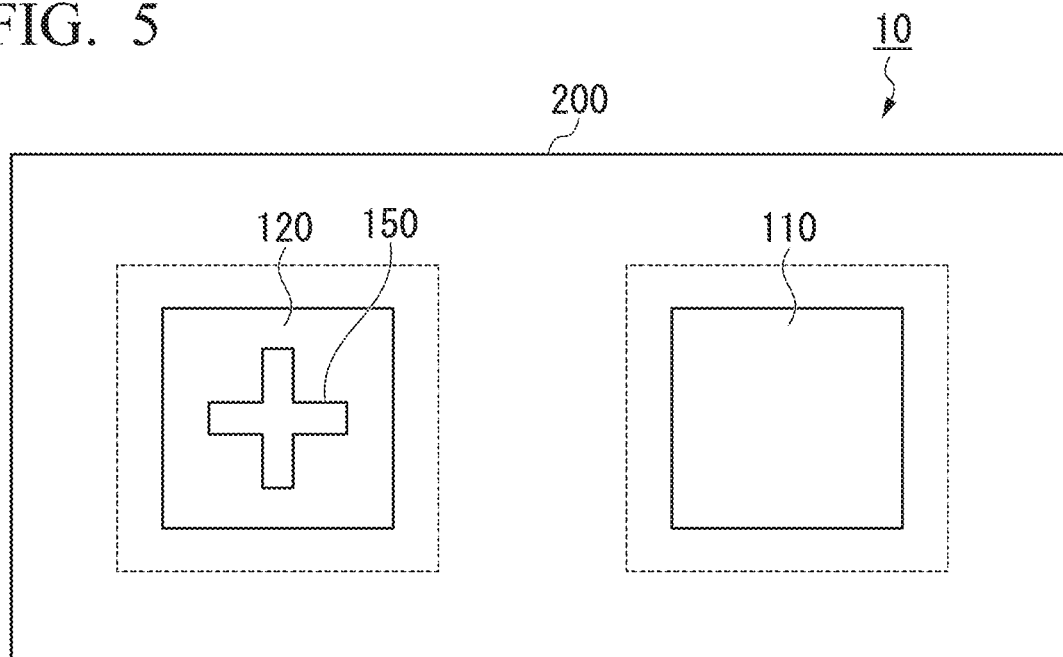
FIG. 5 is a plan view of the semiconductor device according to the first embodiment of the present invention.
Figure 6:
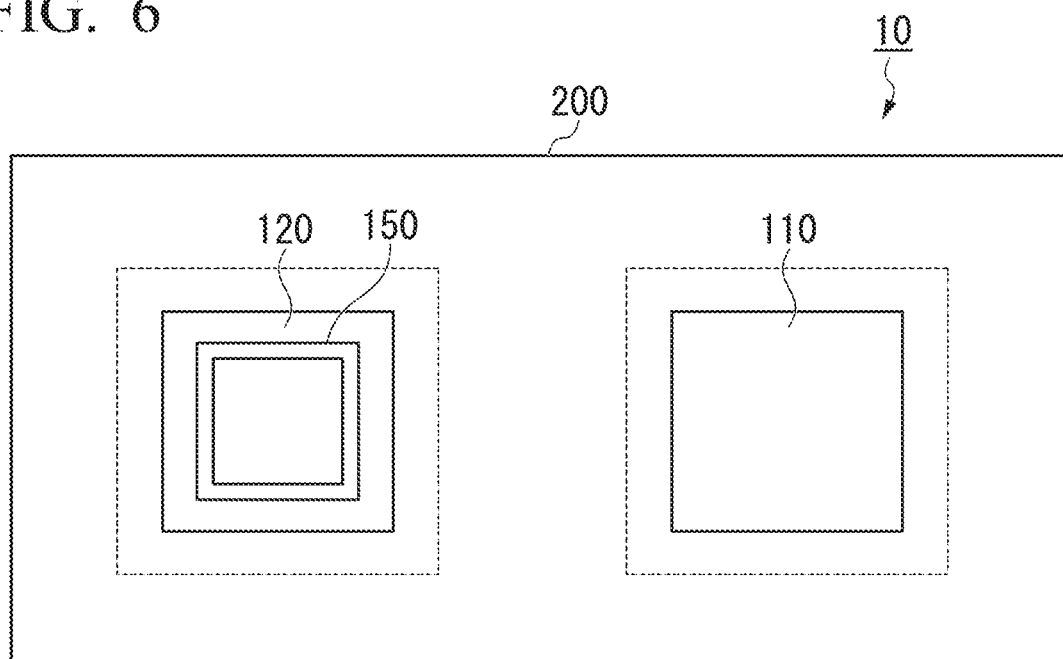
FIG. 6 is a plan view of the semiconductor device according to the first embodiment of the present invention.

FIGS. 4 to 6 show other examples of the shape of the alignment mark 150. FIGS. 4 to 6 are plan views of the semiconductor device 10. As shown in FIG. 4, the alignment mark 150 may be configured as four rectangles arranged in parallel. The direction of the long side of the rectangle that forms the alignment mark 150 is a horizontal direction in FIG. 4. As shown in FIG. 5, the alignment mark 150 may be configured as four rectangles protruding in four different directions from the center of the second pad 120. As shown in FIG. 6, the alignment mark 150 may be configured as a closed region surrounding the center of the second pad 120. The shape of the alignment mark 150 is not limited to the examples shown in FIGS. 2 to 6.

A method for manufacturing the semiconductor device 10 will be described with reference to FIGS. 7 to 23. FIGS. 7 to 23 show a cross-section of a portion that forms the semiconductor device 10.

Figure 7:
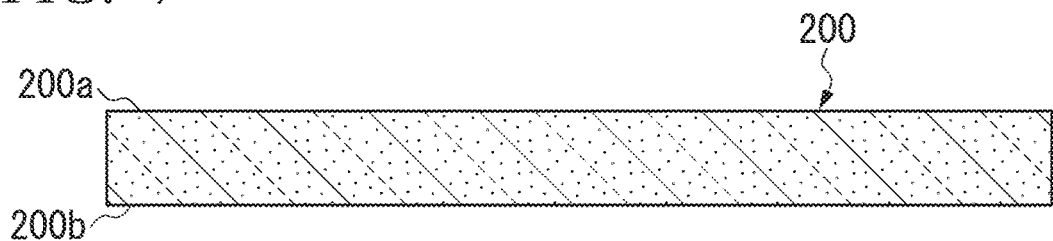
FIG. 7 is a cross-sectional view for describing a method for manufacturing the semiconductor device according to the first embodiment of the present invention.

As shown in FIG. 7, the second semiconductor layer 200 is prepared. For example, the second semiconductor layer 200 is formed of silicon (Si).

Figure 8:
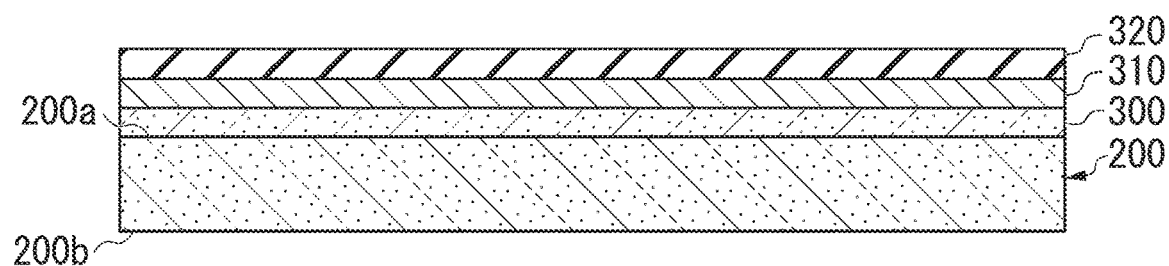
FIG. 8 is a cross-sectional view for describing a method for manufacturing the semiconductor device according to the first embodiment of the present invention.

As shown in FIG. 8, an oxide film 300, a metal film 310, and a resist film 320 are sequentially formed on the surface 200a of the second semiconductor layer 200. The oxide film 300 is stacked on the second semiconductor layer 200. The surface 200a of the second semiconductor layer 200 is covered with the oxide film 300. For example, the oxide film 300 is formed of silicon oxide ($SiO_2$). That is, the oxide film 300 is formed of insulating materials including semiconductors. The metal film 310 is stacked on the oxide film 300. The surface of the oxide film 300 is covered with the metal film 310. The material that forms the metal film 310 is the same as the material that forms the first and second pads 110 and 120. The resist film 320 is stacked on the metal film 310. The surface of the metal film 310 is covered with the resist film 320.

Figure 9:
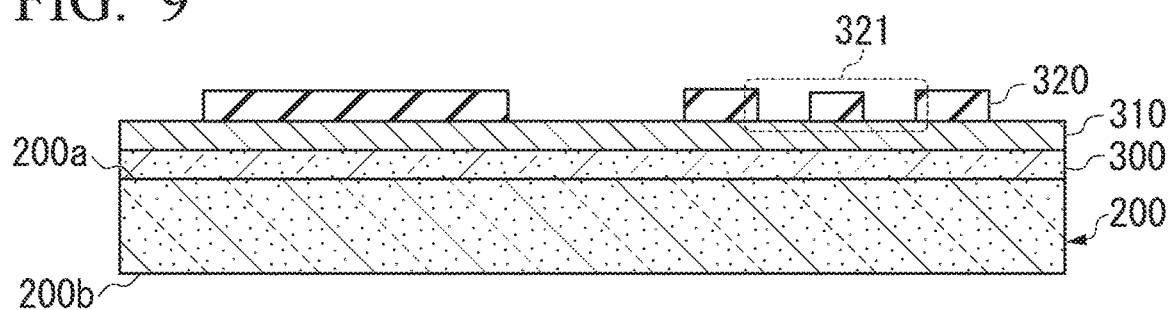
FIG. 9 is a cross-sectional view for describing a method for manufacturing the semiconductor device according to the first embodiment of the present invention.

As shown in FIG. 9, a pattern is formed on the resist film 320 by photolithography. In the resist film 320, the resist film 320 in regions other than the region on which the first and second pads 110 and 120 are formed is removed. In the resist film 320, the resist film 320 in a region on which the alignment mark 150 is formed is removed and a pattern 321 is formed.

Figure 10:
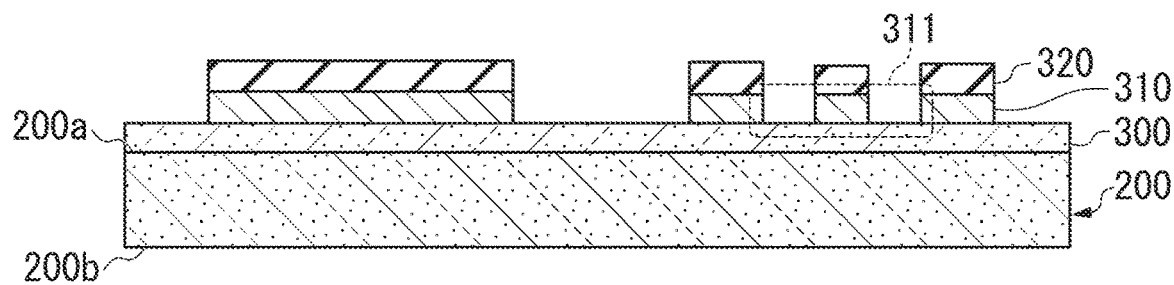
FIG. 10 is a cross-sectional view for describing a method for manufacturing the semiconductor device according to the first embodiment of the present invention.

As shown in FIG. 10, the metal film 310 is etched. The resist film 320 functions as an etching mask. A portion of the metal film 310 other than the portion covered with the resist film 320 is removed through etching of the metal film 310. A portion of the surface of the oxide film 300 is exposed by etching of the metal film 310. In the metal film 310, a pattern 311 corresponding to the pattern 321 is formed in the region on which the alignment mark 150 is formed.

Figure 11:
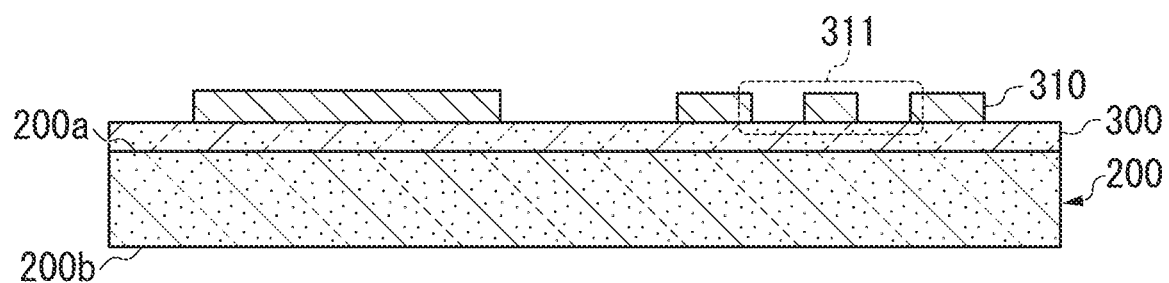
FIG. 11 is a cross-sectional view for describing a method for manufacturing the semiconductor device according to the first embodiment of the present invention.

As shown in FIG. 11, the resist film 320 is removed. In this way, the surface of the metal film 310 is exposed.

Figure 12:
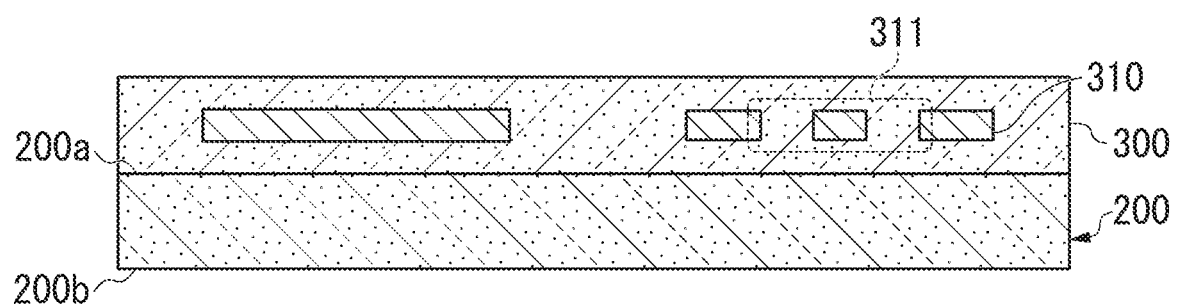
FIG. 12 is a cross-sectional view for describing a method for manufacturing the semiconductor device according to the first embodiment of the present invention.

As shown in FIG. 12, the same material as the material that forms the oxide film 300 is deposited on the surface of the oxide film 300 and the metal film 310. In this way, the surface of the metal film 310 is covered with the oxide film 300.

Figure 13:
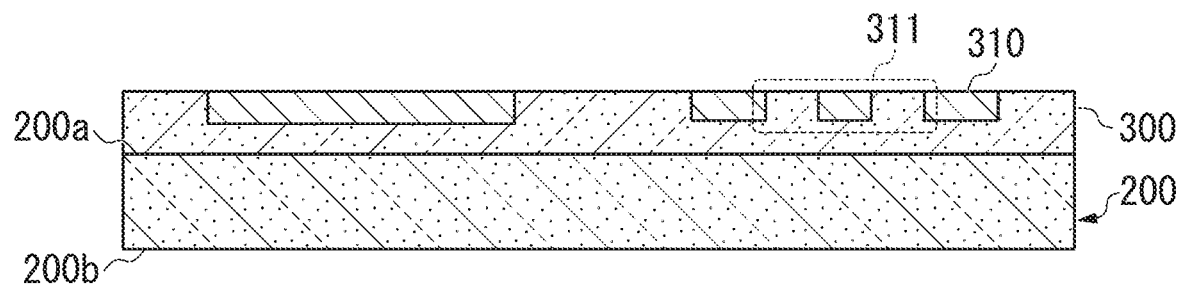
FIG. 13 is a cross-sectional view for describing a method for manufacturing the semiconductor device according to the first embodiment of the present invention.

As shown in FIG. 13, the surface of the oxide film 300 is scraped off. For example, the oxide film 300 is scraped off by chemical mechanical polishing (CMP). In this way, the oxide film 300 is planarized and the metal film 310 is exposed.

Figure 14:
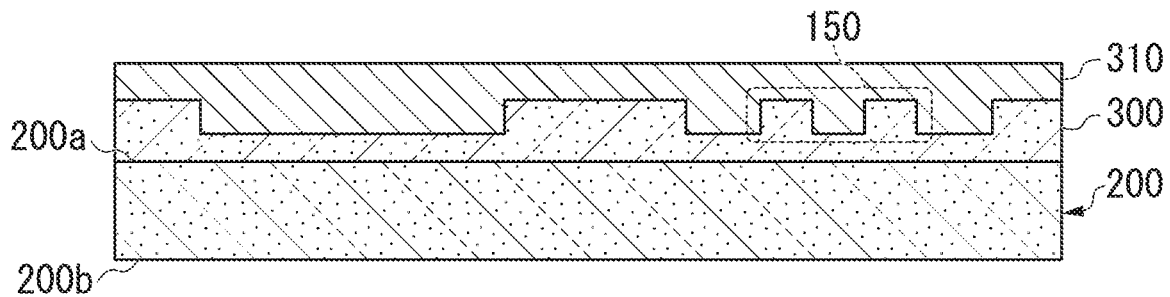
FIG. 14 is a cross-sectional view for describing a method for manufacturing the semiconductor device according to the first embodiment of the present invention.

As shown in FIG. 14, the same material as the material that forms the metal film 310 is deposited on the surface of the oxide film 300 and the metal film 310, whereby the surface of the oxide film 300 is covered with the metal film 310. In this way, the alignment mark 150 is formed on the region on which the pattern 311 shown in FIG. 13 is formed.

Figure 15:
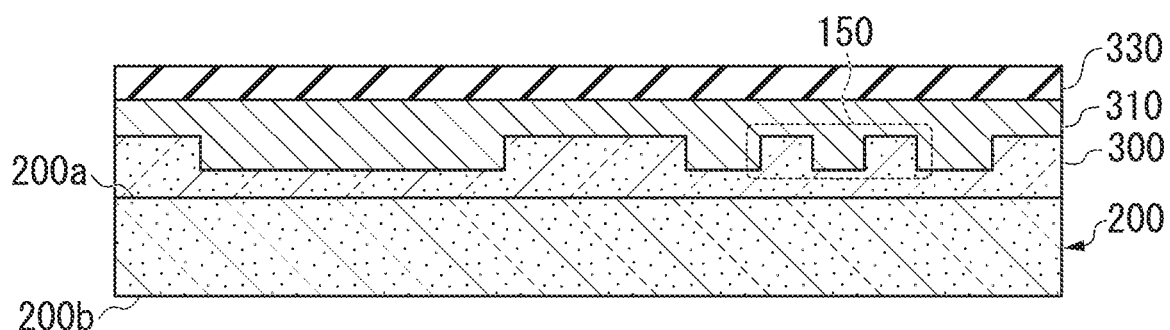
FIG. 15 is a cross-sectional view for describing a method for manufacturing the semiconductor device according to the first embodiment of the present invention.

As shown in FIG. 15, a resist film 330 is formed on the surface of the metal film 310. The surface of the metal film 310 is covered with the resist film 330.

Figure 16:
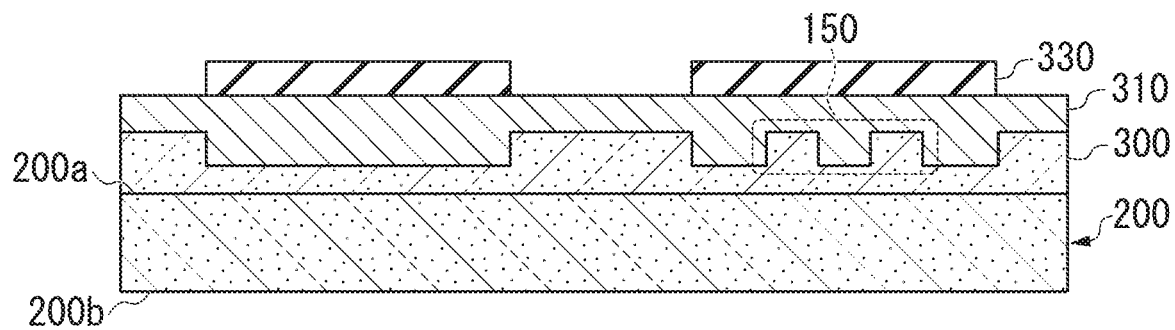
FIG. 16 is a cross-sectional view for describing a method for manufacturing the semiconductor device according to the first embodiment of the present invention.

As shown in FIG. 16, a pattern is formed on the resist film 330 by photolithography. In the resist film 330, the resist film 330 in the region other than the region on which the first and second pads 110 and 120 are formed is removed.

Figure 17:
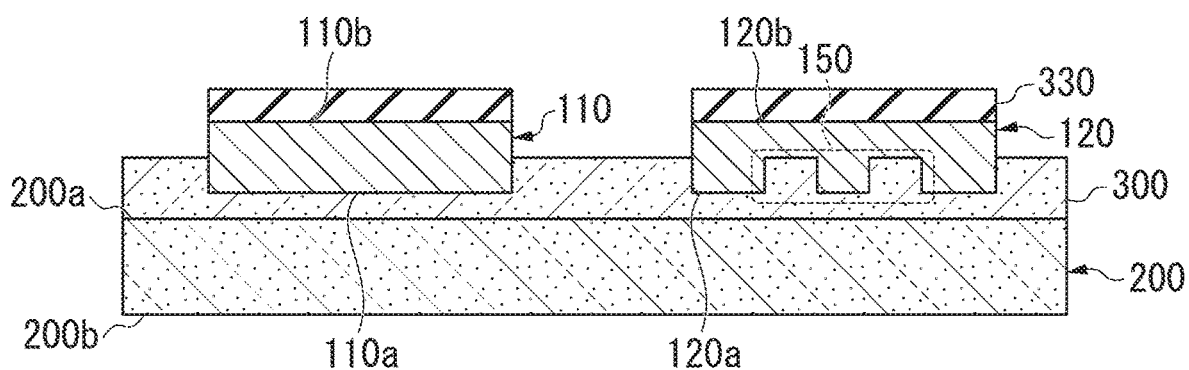
FIG. 17 is a cross-sectional view for describing a method for manufacturing the semiconductor device according to the first embodiment of the present invention.

As shown in FIG. 17, the metal film 310 is etched. The resist film 330 functions as an etching mask. A portion of the metal film 310 other than the portion covered with the resist film 330 is removed through etching of the metal film 310. A portion of the surface of the oxide film 300 is exposed by etching of the metal film 310. In this way, the first and second pads 110 and 120 are formed. The surface 120a of the second pad 120 on which the alignment mark 150 is formed is in contact with the oxide film 300. The surface 120b of the second pad 120 is in contact with the resist film 330. The surface 110a of the first pad 110 is in contact with the oxide film 300. The surface 110b of the first pad 110 is in contact with the resist film 330.

As shown in FIGS. 8 to 17, the first and second pads 110 and 120 are formed by the same step. The surface 110a of the first pad 110 and the surface 120a of the second pad 120 are the same as the surface of the metal film 310 that is in contact with the oxide film 300 in FIG. 8. Therefore, the surfaces 110a and 120a are disposed in the same plane. The surface 110b of the first pad 110 and the surface 120b of the second pad 120 are the same as the surface of the metal film 310 in FIG. 14. Therefore, the surfaces 110b and 120b are disposed in the same plane.

Figure 18:
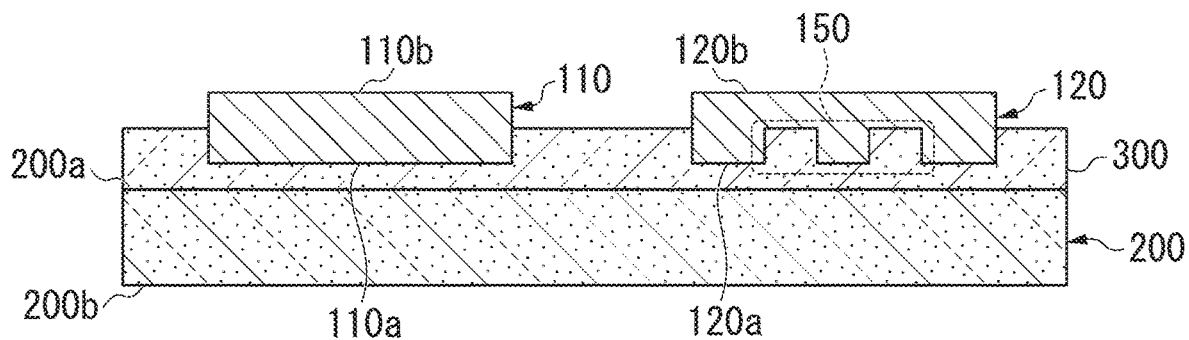
FIG. 18 is a cross-sectional view for describing a method for manufacturing the semiconductor device according to the first embodiment of the present invention.

As shown in FIG. 18, the resist film 330 is removed. In this way, the surface 110b of the first pad 110 and the surface 120b of the second pad 120 are exposed.

Figure 19:
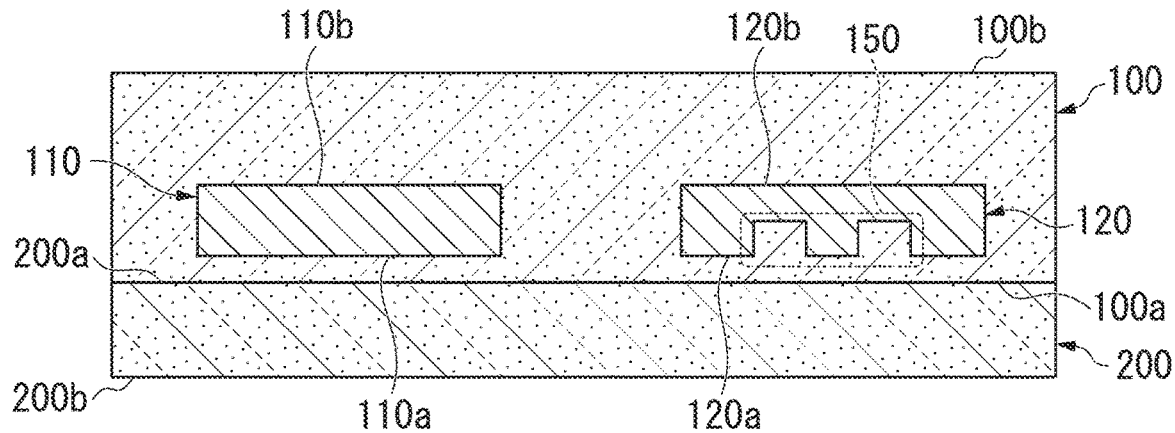
FIG. 19 is a cross-sectional view for describing a method for manufacturing the semiconductor device according to the first embodiment of the present invention.

As shown in FIG. 19, the same material as the material that forms the oxide film 300 is deposited on the surface of the oxide film 300, the surface 110b of the first pad 110, and the surface 120b of the second pad 120. In this way, the first semiconductor layer 100 is formed.

By the steps shown in FIGS. 8, 12, and 19, the first semiconductor layer 100 is stacked on the second semiconductor layer 200. Subsequently to the step shown in FIG. 19, a supporting substrate or a semiconductor substrate may be stacked on the surface 100b of the first semiconductor layer 100.

Figure 20:
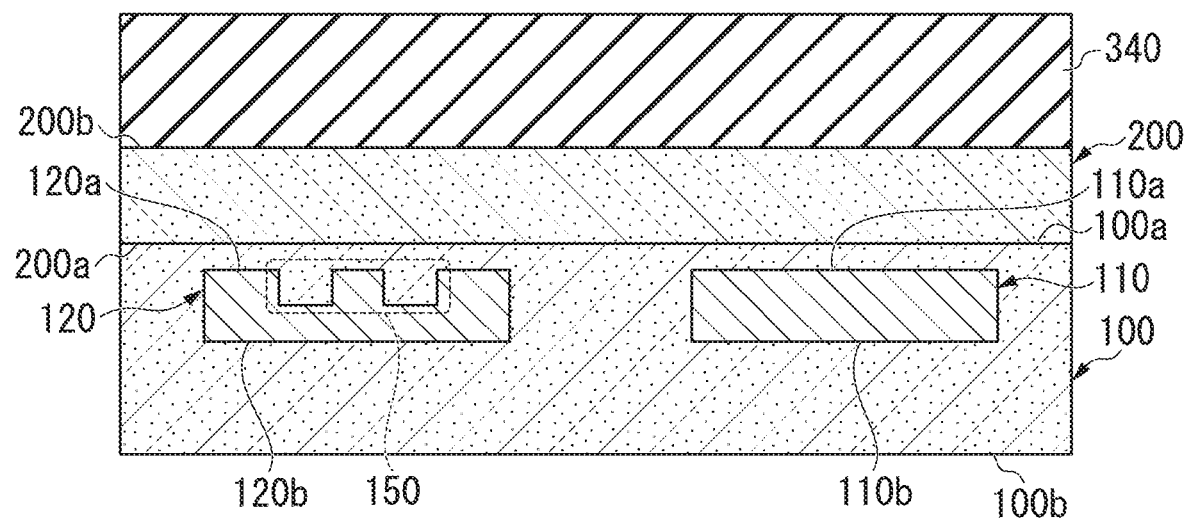
FIG. 20 is a cross-sectional view for describing a method for manufacturing the semiconductor device according to the first embodiment of the present invention.

As shown in FIG. 20, a resist film 340 is formed on the surface 200b of the second semiconductor layer 200. The surface 200b of the second semiconductor layer 200 is covered with the resist film 340. Since the second semiconductor layer 200 is thick, the resist film 340 is formed to be thick.

Figure 21:
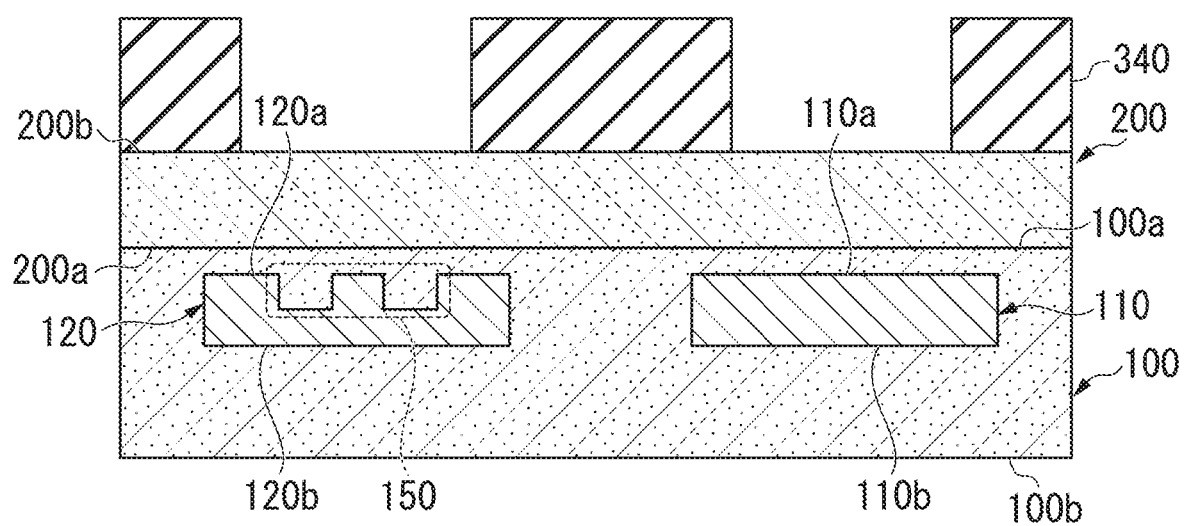
FIG. 21 is a cross-sectional view for describing a method for manufacturing the semiconductor device according to the first embodiment of the present invention.

As shown in FIG. 21, a pattern is formed on the resist film 340 by photolithography. In the resist film 340, the resist film 340 on the region on which the first, second, third, and fourth openings 130, 140, 210, and 220 are formed is removed.

Figure 22:
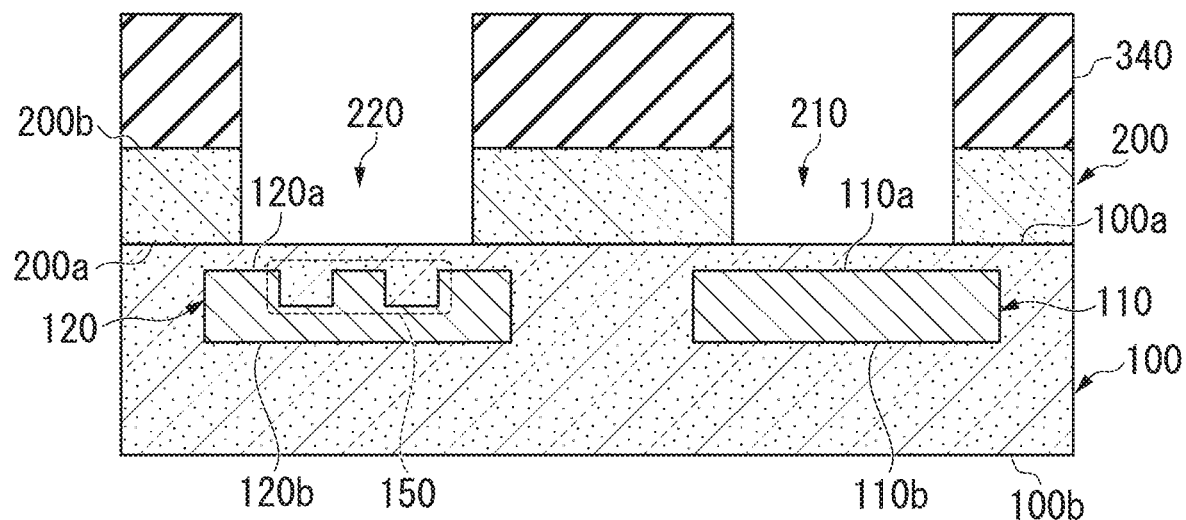
FIG. 22 is a cross-sectional view for describing a method for manufacturing the semiconductor device according to the first embodiment of the present invention.

As shown in FIG. 22, the second semiconductor layer 200 is etched. The resist film 340 functions as an etching mask. A portion of the second semiconductor layer 200 other than the portion covered with the resist film 340 is removed through etching of the second semiconductor layer 200. A portion of the surface of the first semiconductor layer 100 is exposed by etching the second semiconductor layer 200. In this way, the third and fourth openings 210 and 220 are formed.

Figure 23:
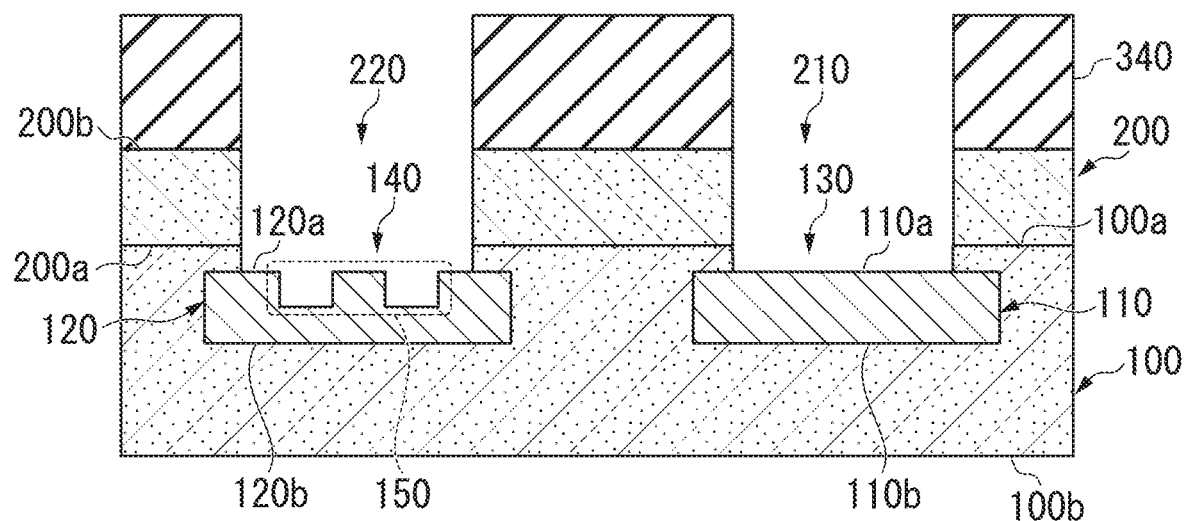
FIG. 23 is a cross-sectional view for describing a method for manufacturing the semiconductor device according to the first embodiment of the present invention.

As shown in FIG. 23, the first semiconductor layer 100 is etched. The resist film 340 functions as an etching mask. A portion of the first semiconductor layer 100 other than the portion covered with the second semiconductor layer 200 is removed through etching of the first semiconductor layer 100. The first and second pads 110 and 120 function as an etching stopper. A portion of the surface of the first and second pads 110 and 120 is exposed by etching the first semiconductor layer 100. In this way, the first and second openings 130 and 140 are formed.

Subsequently to the step shown in FIG. 23, the resist film 340 is removed. In this way, as shown in FIG. 1, the surface 200b of the second semiconductor layer 200 is exposed.

As described above, the semiconductor device 10 includes the first semiconductor layer 100, the second semiconductor layer 200, the first pad 110, and the second pad 120. The first semiconductor layer 100 has the surface 100a (a first main surface). The first and second openings 130 and 140 are formed in the surface 100a. The second semiconductor layer 200 has the surface 200a (a second main surface). The second semiconductor layer 200 is stacked on the first semiconductor layer 100. The third and fourth openings 210 and 220 are formed in the second semiconductor layer 200. The first pad 110 has the surface 110a (a third main surface) for wire bonding The surface 110a is disposed in the first opening 130. The second pad 120 has the surface 120a (a fourth main surface) on which the alignment mark 150 is formed. The surface 120a is disposed in the second opening 140. The surface 200a faces the surface 100a. The third and fourth openings 210 and 220 penetrate the second semiconductor layer 200 in the thickness direction Dr1 of the second semiconductor layer 200. The first opening 130 overlaps the third opening 210. The second opening 140 overlaps the fourth opening 220. The width W10 of the first pad 110 in the direction Dr2 (a second direction) perpendicular to the thickness direction Dr1 (a first direction) of the first semiconductor layer 100 is larger than the width W11 of the first opening 130 in the direction Dr2. The width W12 of the second pad 120 in the direction Dr2 is larger than the width W13 of the second opening 140 in the direction Dr2.

The first and second pads 110 and 120 may be formed of the same metal. The alignment mark 150 is a concave portion formed in the surface 120a.

As described above, the method for forming the semiconductor device 10 has a first step (FIGS. 8, 12, and 19), a second step (FIGS. 8, 10, 14, and 17), a third step (FIG. 22), and a fourth step (FIG. 23). The first step is a step of stacking the first semiconductor layer 100 on the second semiconductor layer 200. The first semiconductor layer 100 has the surface 100a (the first main surface). The second semiconductor layer 200 has the surface 200a (the second main surface). The surface 200a faces the surface 100a. The second step is a step of forming the first and second pads 110 and 120 in the first semiconductor layer 100. The first pad 110 has the surface 110a (the third main surface) for wire bonding. The second pad 120 has the surface 120a (the fourth main surface) on which the alignment mark 150 is formed. The third step is a step of forming the third and fourth openings 210 and 220 in the second semiconductor layer 200. The third and fourth openings 210 and 220 penetrate the second semiconductor layer 200 in the thickness direction Dr1 of the second semiconductor layer 200. The fourth step is a step of forming the first and second openings 130 and 140 in the surface 100a of the first semiconductor layer 100. The first opening 130 overlaps the third opening 210. The second opening 140 overlaps the fourth opening 220. The surface 110a is disposed in the first opening 130. The surface 120a is disposed in the second opening 140.

The order of performing the first to fourth steps is arbitrary. The method for manufacturing the semiconductor devices of the respective aspects of the present invention need not have steps other than the first to fourth steps.

In the semiconductor device 10 of the first embodiment, the second pad 120 having the surface 120a on which the alignment mark 150 is formed is disposed. Due to this, the alignment accuracy of wire bonding positions is improved.

First Modification of First Embodiment

Figure 24:
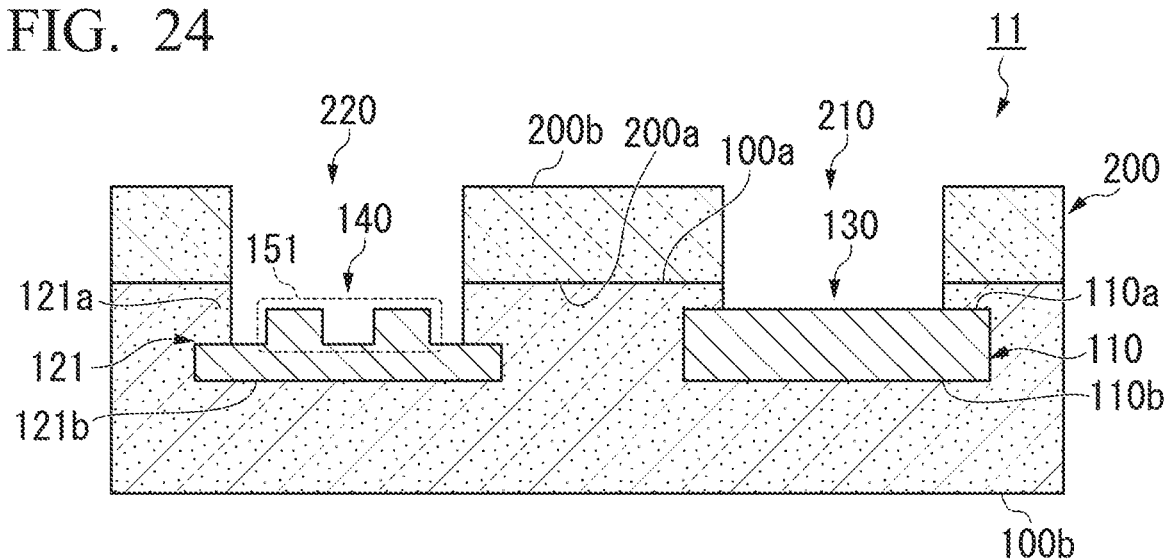
FIG. 24 is a cross-sectional view of a semiconductor device according to a first modification of the first embodiment of the present invention.

FIG. 24 shows a configuration of a semiconductor device 11 according to a first modification of the first embodiment of the present invention. FIG. 24 shows a cross-section of the semiconductor device 11. The differences between FIGS. 1 and 24 will be described.

In the semiconductor device 11, the second pad 120 shown in FIG. 1 is changed to a second pad 121. The second pad 121 is formed of the same material as the material that forms the second pad 120.

In the second pad 121, the surface 120a shown in FIG. 1 is changed to a surface 121a, and the surface 120b shown in FIG. 1 is changed to a surface 121b. An alignment mark 151 is disposed on the surface 121a. A convex portion formed on the surface 121a forms the alignment mark 151.

The configuration shown in FIG. 24 other than the above-described components is the same as the configuration shown in FIG. 1.

A method for manufacturing the semiconductor device 11 will be described with reference to FIGS. 25 to 30. FIGS. 25 to 30 show a cross-section of a portion that forms the semiconductor device 11.

Figure 25:
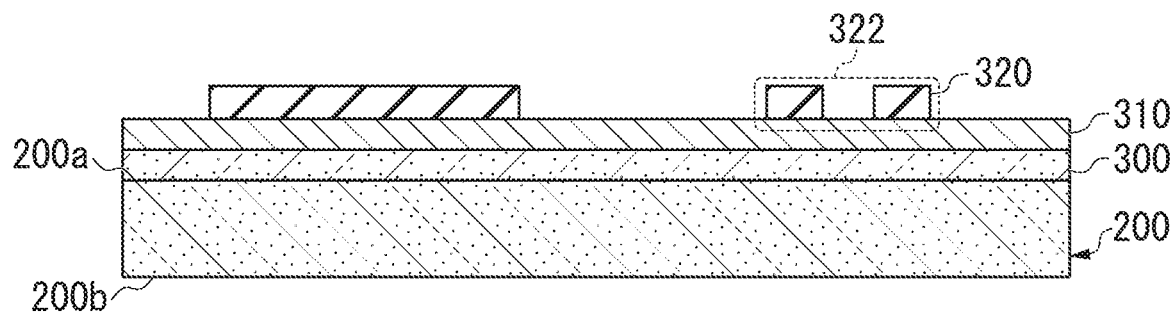
FIG. 25 is a cross-sectional view for describing a method for manufacturing a semiconductor device according to the first modification of the first embodiment of the present invention.

After the same steps as the steps shown in FIGS. 7 and 8 are performed, a pattern is formed on the resist film 320 by photolithography as shown in FIG. 25. In the resist film 320, the resist film 320 in a region other than the region on which the first and second pads 110 and 121 are formed is removed. In the resist film 320, the resist film 320 in the region on which the alignment mark 151 is formed is removed and a pattern 322 is formed.

Figure 26:
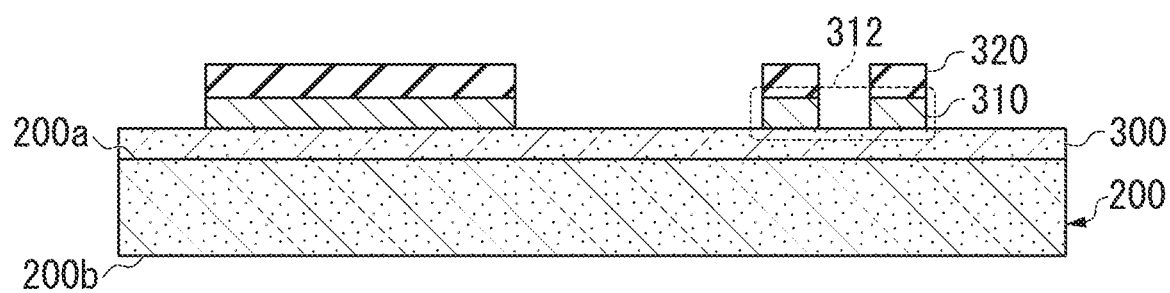
FIG. 26 is a cross-sectional view for describing a method for manufacturing a semiconductor device according to the first modification of the first embodiment of the present invention.

As shown in FIG. 26, the metal film 310 is etched. The resist film 320 functions as an etching mask. A portion of the metal film 310 other than the portion covered with the resist film 320 is removed through etching of the metal film 310. A portion of the surface of the oxide film 300 is exposed by etching the metal film 310. In the metal film 310, a pattern 312 corresponding to the pattern 322 is formed in the region on which the alignment mark 151 is formed.

Figure 27:
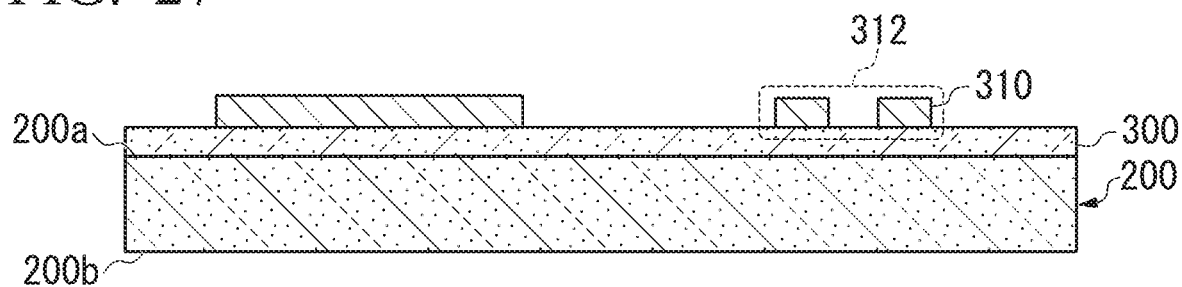
FIG. 27 is a cross-sectional view for describing a method for manufacturing a semiconductor device according to the first modification of the first embodiment of the present invention.

As shown in FIG. 27, the resist film 320 is removed. In this way, the surface of the metal film 310 is exposed.

Figure 28:
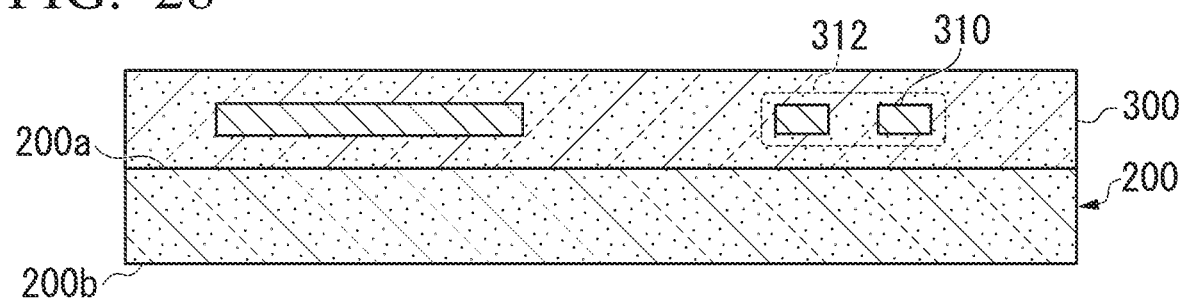
FIG. 28 is a cross-sectional view for describing a method for manufacturing a semiconductor device according to the first modification of the first embodiment of the present invention.

As shown in FIG. 28, the same material as the material that forms the oxide film 300 is deposited on the surface of the oxide film 300 and the metal film 310. In this way, the surface of the metal film 310 is covered with the oxide film 300.

Figure 29:
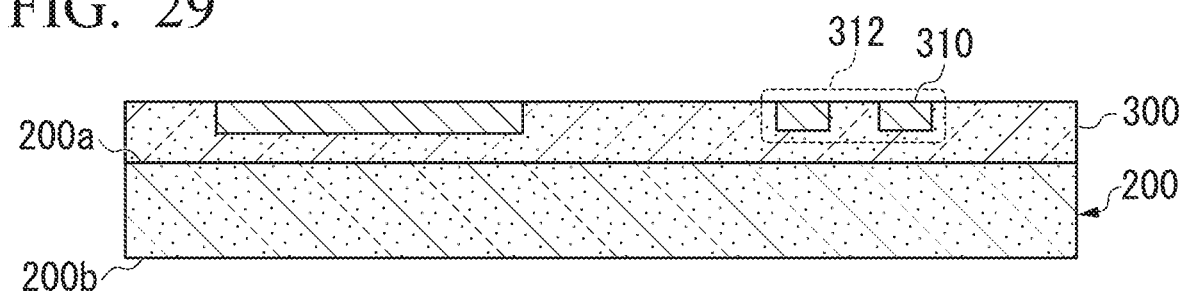
FIG. 29 is a cross-sectional view for describing a method for manufacturing a semiconductor device according to the first modification of the first embodiment of the present invention.

As shown in FIG. 29, the surface of the oxide film 300 is scraped off. For example, the oxide film 300 is scraped off by chemical mechanical polishing (CMP). In this way, the oxide film 300 is planarized and the metal film 310 is exposed.

Figure 30:
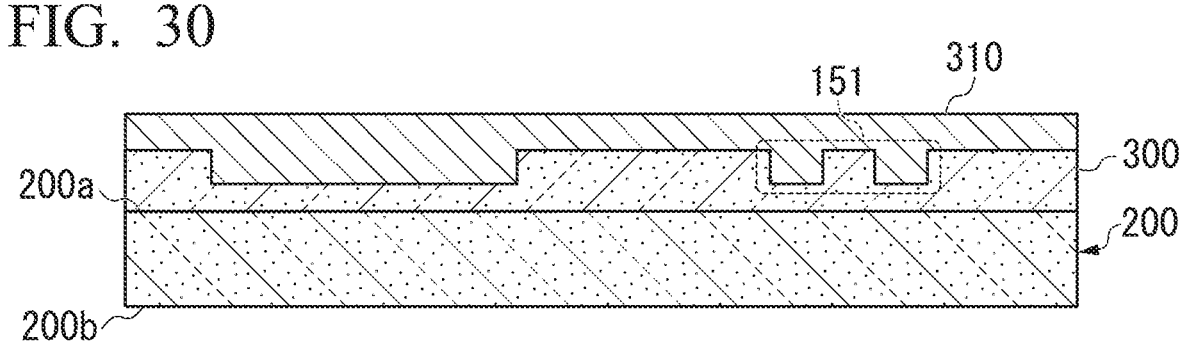
FIG. 30 is a cross-sectional view for describing a method for manufacturing a semiconductor device according to the first modification of the first embodiment of the present invention.

As shown in FIG. 30, the same material as the material that forms the metal film 310 is deposited on the surface of the oxide film 300 and the metal film 310, whereby the surface of the oxide film 300 is covered with the metal film 310. In this way, the alignment mark 151 is formed on the region on which the pattern 312 shown in FIG. 29 is formed.

After the step shown in FIG. 30 is performed, the same steps as the steps shown in FIGS. 15 to 23 are performed. After the same step as the step shown in FIG. 23 is performed, the resist film 340 is removed. In this way, as shown in FIG. 24, the surface 200b of the second semiconductor layer 200 is exposed.

As described above, the alignment mark 151 may be a convex portion formed on the surface 120a.

Second Modification of First Embodiment

Figure 31:
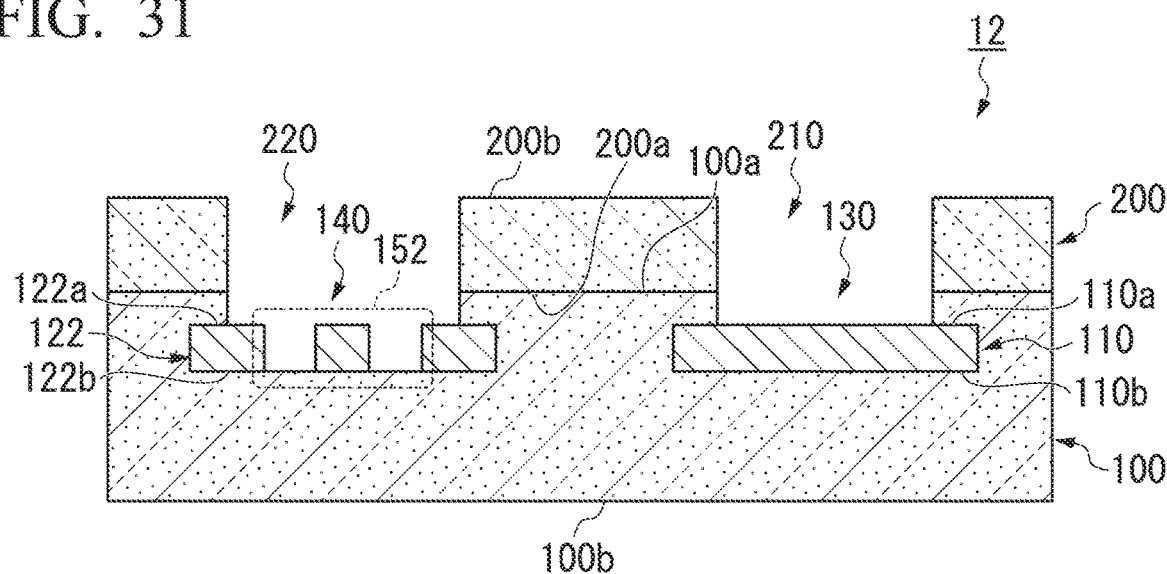
FIG. 31 is a cross-sectional view of a semiconductor device according to a second modification of the first embodiment of the present invention.

FIG. 31 shows a configuration of a semiconductor device 12 according to a second modification of the first embodiment. FIG. 31 shows a cross-section of the semiconductor device 12. The differences between FIGS. 1 and 31 will be described.

In the semiconductor device 12, the second pad 120 shown in FIG. 1 is changed to a second pad 122. The second pad 122 is formed of the same material as the material that forms the second pad 120.

In the second pad 122, the surface 120a shown in FIG. 1 is changed to a surface 122a, and the surface 120b shown in FIG. 1 is changed to a surface 122b. An alignment mark 152 is disposed on the surfaces 122a and 122b. A hole penetrating the second pad 122 forms the alignment mark 152. That is, the alignment mark 152 is a through-hole formed in the second pad 122. For example, the thicknesses of the first and second pads 110 and 122 of the semiconductor device 12 are smaller than the thicknesses of the first and second pads 110 and 120 of the semiconductor device 10 shown in FIG. 1. However, the thicknesses of the first and second pads 110 and 122 of the semiconductor device 12 are arbitrary.

The configuration shown in FIG. 31 other than the above-described components is the same as the configuration shown in FIG. 1.

In a method for manufacturing the semiconductor device 12, the same steps as the steps shown in FIGS. 7 to 12 are performed. After the step shown in FIG. 12 is performed, the surface of the oxide film 300 is planarized. After that, the same steps as the steps shown in FIGS. 20 to 23 are performed. After the same step as the step shown in FIG. 23 is performed, the resist film 340 is removed. In this way, as shown in FIG. 31, the surface 200b of the second semiconductor layer 200 is exposed.

As described above, the alignment mark 152 may be a through-hole formed in the second pad 122.

Second Embodiment

Figure 32:
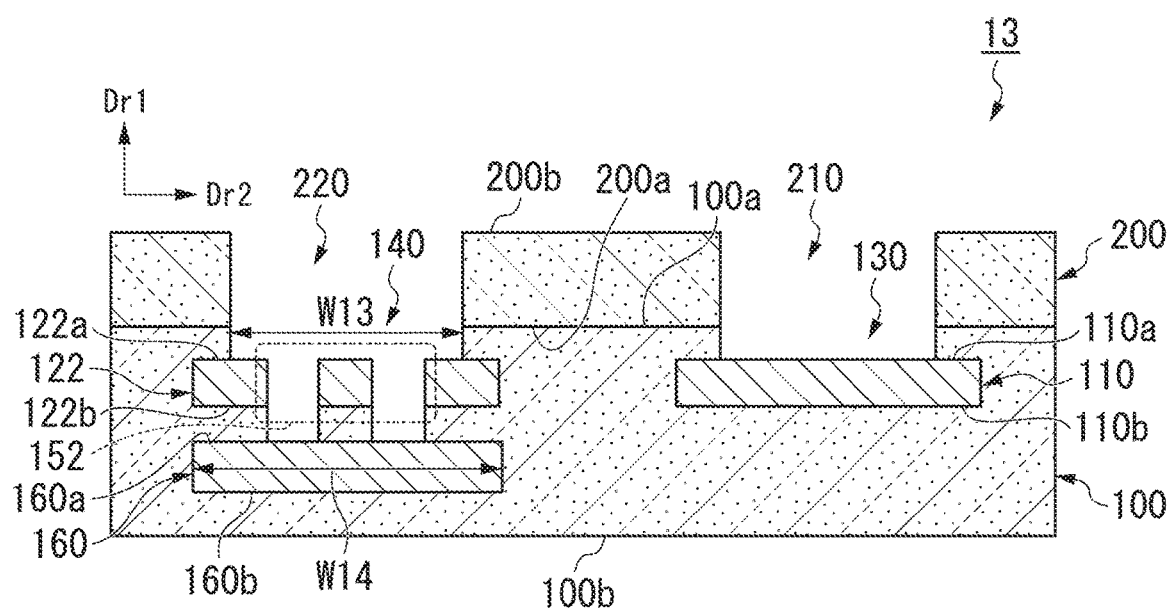
FIG. 32 is a cross-sectional view of a semiconductor device according to a second embodiment of the present invention.

FIG. 32 shows a configuration of a semiconductor device 13 according to a second embodiment of the present invention. FIG. 32 shows a cross-section of the semiconductor device 13. The differences between FIGS. 31 and 32 will be described.

The semiconductor device 13 has a metal film 160. The metal film 160 is formed of a conductive material. For example, the conductive material that forms the metal film 160 may be a metal such as aluminum (Al) or copper (Cu). The metal film 160 is formed of a metal the same as or different from the metal that forms the second pad 122. The metal film 160 is formed of a metal of which the etching rate is slower than that of the first semiconductor layer 100 when the first semiconductor layer 100 is etched. A plurality of metal films 160 may be disposed in the first semiconductor layer 100.

The metal film 160 has a surface 160a and a surface 160b. The surfaces 160a and 160b are main surfaces of the metal film 160. The main surfaces of the metal film 160 are relatively large surfaces among the plurality of surfaces that form the surfaces of the metal film 160. The surfaces 160a and 160b face in opposite directions. The surface 160a faces the surface 122b. In the first semiconductor layer 100, the second opening 140 is formed between the surface 100a and the second pad 122 and between the second pad 122 and the metal film 160. The surface 160a of the second opening 140 is exposed. The second pad 122 is disposed between the second semiconductor layer 200 and the metal film 160.

A width W14 of the metal film 160 is larger than a width W13 of the second opening 140. The widths W13 and W14 are widths in the direction Dr2 perpendicular to the thickness direction Dr1 of the first semiconductor layer 100. The metal film 160 is electrically insulated from the first pad 110. The metal film 160 functions as an etching stopper.

The configuration shown in FIG. 32 other than the above-described components is the same as the configuration shown in FIG. 31.

A method for manufacturing the semiconductor device 13 will be described with reference to FIGS. 33 to 46. FIGS. 33 to 46 show a cross-section of a portion that forms the semiconductor device 13.

Figure 33:
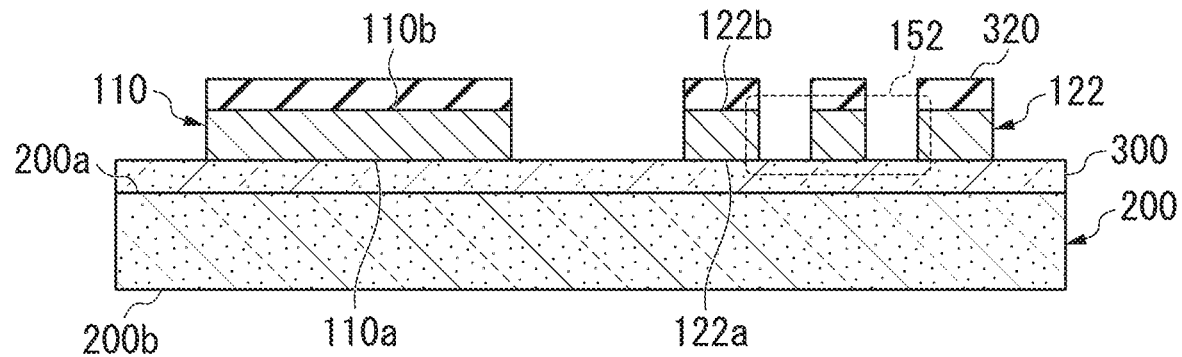
FIG. 33 is a cross-sectional view for describing a method for manufacturing the semiconductor device according to the second embodiment of the present invention.

In a method for manufacturing the semiconductor device 13, the same steps as the steps shown in FIGS. 7 to 9 are performed. After the step shown in FIG. 9 is performed, the metal film 310 is etched as shown in FIG. 33. The resist film 320 functions as an etching mask. A portion of the metal film 310 other than the portion covered with the resist film 320 is removed through etching of the metal film 310. A portion of the surface of the oxide film 300 is exposed by etching the metal film 310. In this way, the first and second pads 110 and 122 are formed. The surface 122a of the second pad 122 on which the alignment mark 152 is formed is in contact with the oxide film 300. The surface 122b of the second pad 122 is in contact with the resist film 320. The surface 110a of the first pad 110 is in contact with the oxide film 300. The surface 110b of the first pad 110 is in contact with the resist film 320.

Figure 34:
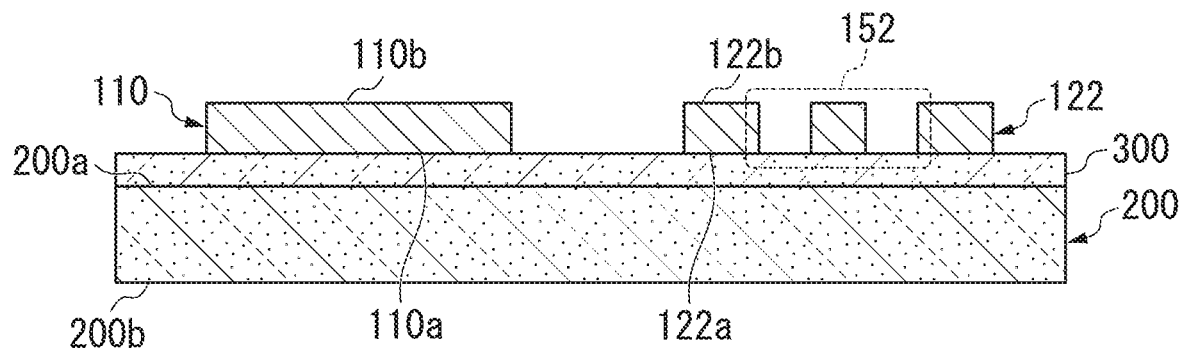
FIG. 34 is a cross-sectional view for describing a method for manufacturing the semiconductor device according to the second embodiment of the present invention.

As shown in FIG. 34, the resist film 320 is removed. In this way, the surface 110b of the first pad 110 and the surface 122b of the second pad 122 are exposed.

Figure 35:
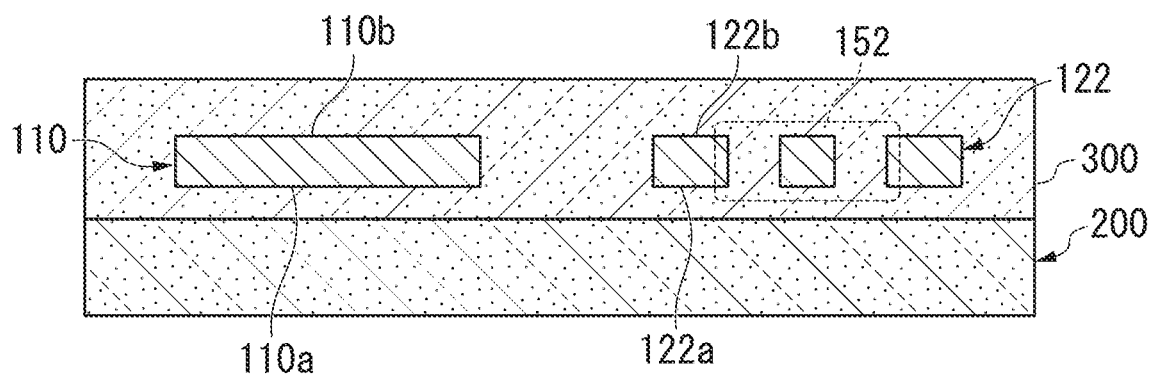
FIG. 35 is a cross-sectional view for describing a method for manufacturing the semiconductor device according to the second embodiment of the present invention.

As shown in FIG. 35, the same material as the material that forms the oxide film 300 is deposited on the surface of the oxide film 300, the surface 110b of the first pad 110, and the surface 122b of the second pad 122. In this way, the surface 110b of the first pad 110 and the surface 122b of the second pad 122 are covered with the oxide film 300.

Figure 36:
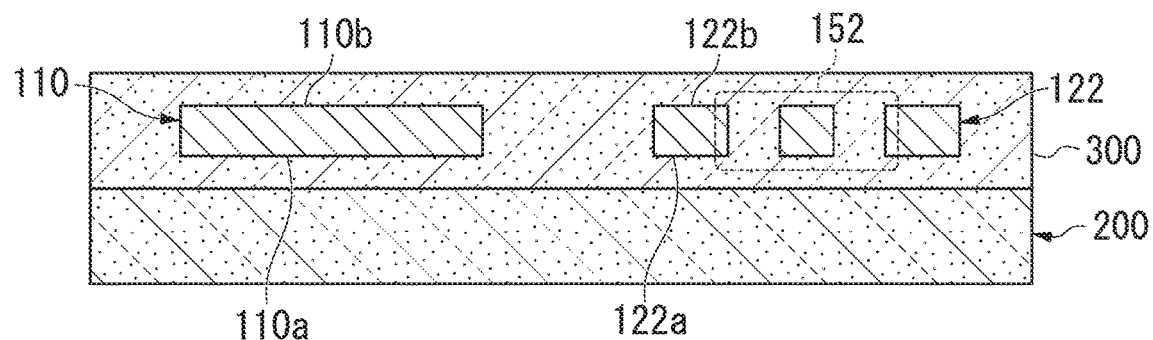
FIG. 36 is a cross-sectional view for describing a method for manufacturing the semiconductor device according to the second embodiment of the present invention.

As shown in FIG. 36, the surface of the oxide film 300 is scraped off. For example, the oxide film 300 is scraped off by chemical mechanical polishing (CMP). In this way, the oxide film 300 is planarized. In this case, the first and second pads 110 and 122 are not exposed.

Figure 37:
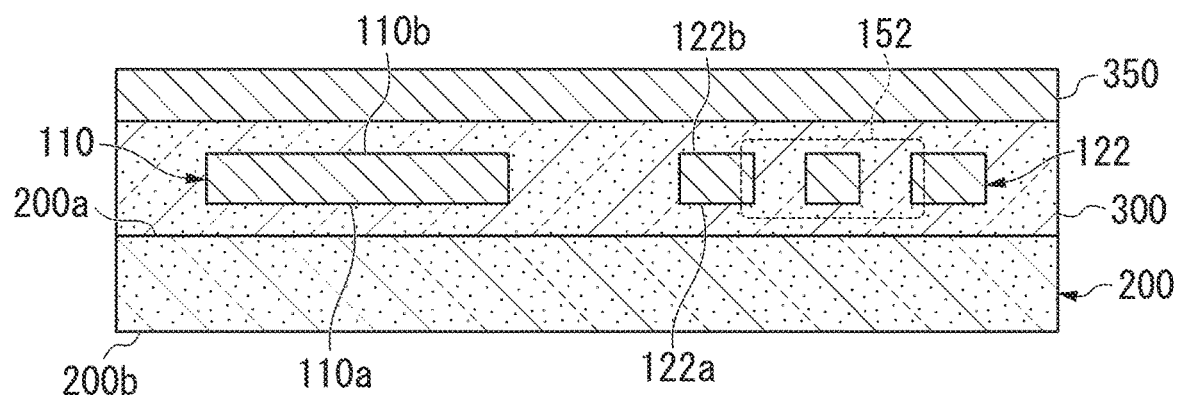
FIG. 37 is a cross-sectional view for describing a method for manufacturing the semiconductor device according to the second embodiment of the present invention.

As shown in FIG. 37, the metal film 350 is deposited on the surface of the oxide film 300 whereby the surface of the oxide film 300 is covered with the metal film 350. The material that forms the metal film 350 is the same as the material that forms the metal film 160.

Figure 38:
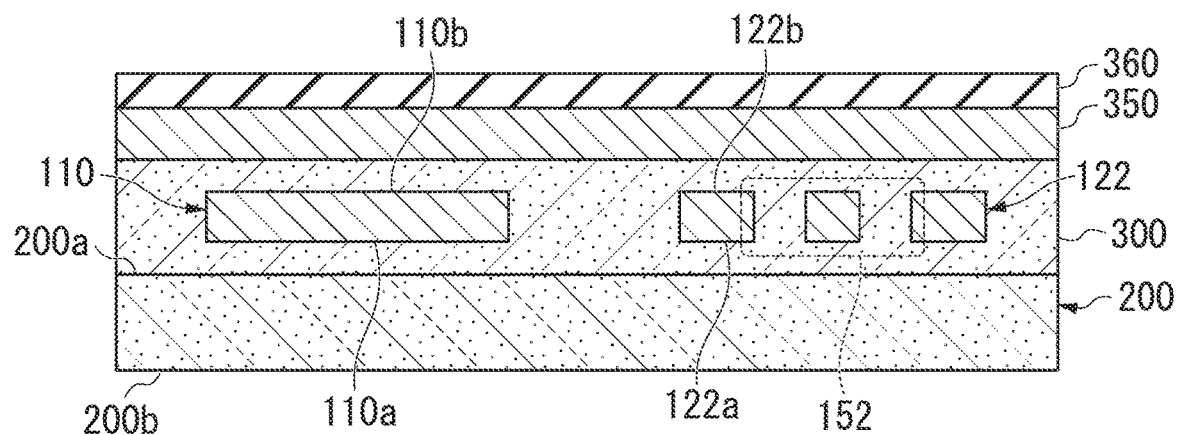
FIG. 38 is a cross-sectional view for describing a method for manufacturing the semiconductor device according to the second embodiment of the present invention.

As shown in FIG. 38, a resist film 360 is formed on the surface of the metal film 350. The surface of the metal film 350 is covered with the resist film 360.

Figure 39:
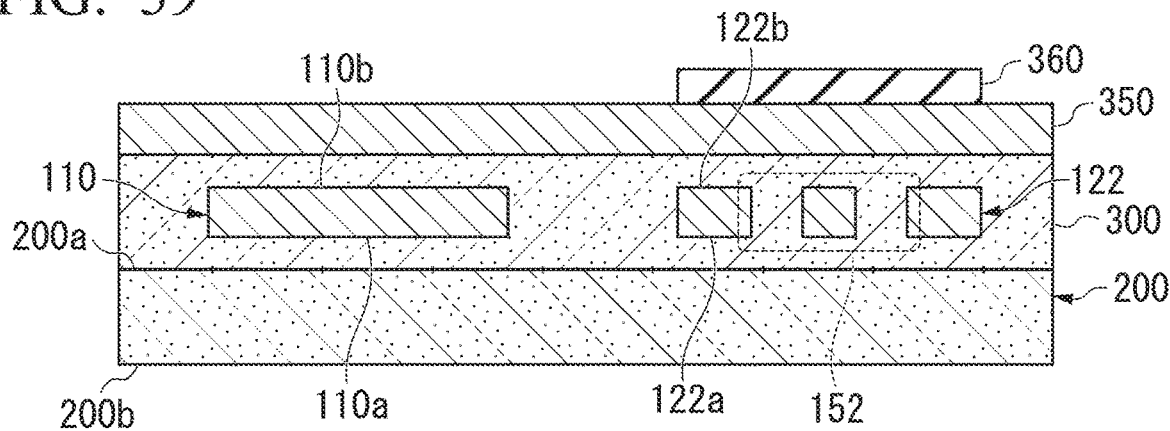
FIG. 39 is a cross-sectional view for describing a method for manufacturing the semiconductor device according to the second embodiment of the present invention.

As shown in FIG. 39, a pattern is formed on the resist film 360 by photolithography. In the resist film 360, the resist film 360 in a region other than the region on which the metal film 160 is formed is removed.

Figure 40:
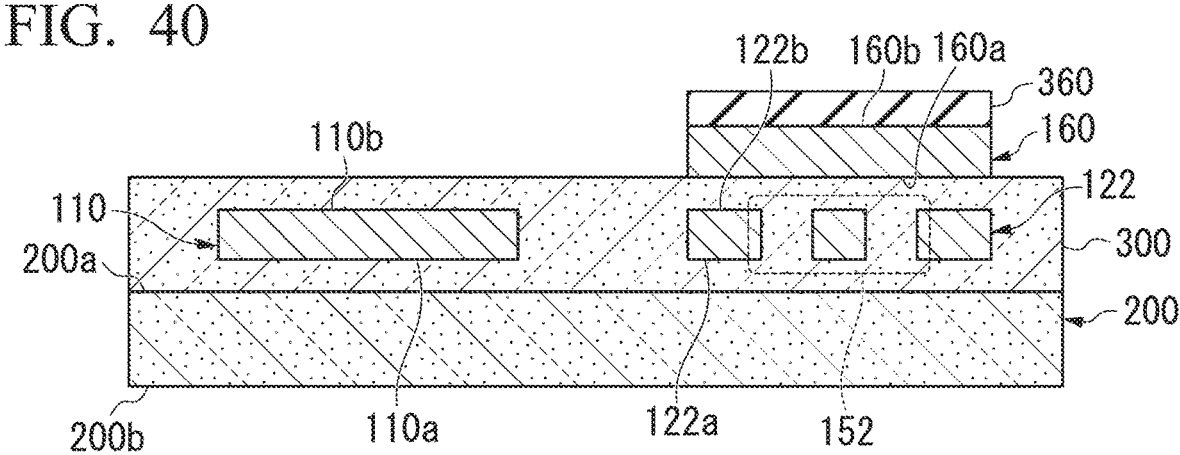
FIG. 40 is a cross-sectional view for describing a method for manufacturing the semiconductor device according to the second embodiment of the present invention.

As shown in FIG. 40, the metal film 350 is etched. The resist film 360 functions as an etching mask. A portion of the metal film 350 other than the portion covered with the resist film 360 is removed through etching of the metal film 350. A portion of the surface of the oxide film 300 is exposed by etching the metal film 350. In this way, a metal film 160 is formed. The surface 160a of the metal film 160 is in contact with the oxide film 300. The surface 160b of the metal film 160 is in contact with the resist film 360.

Figure 41:
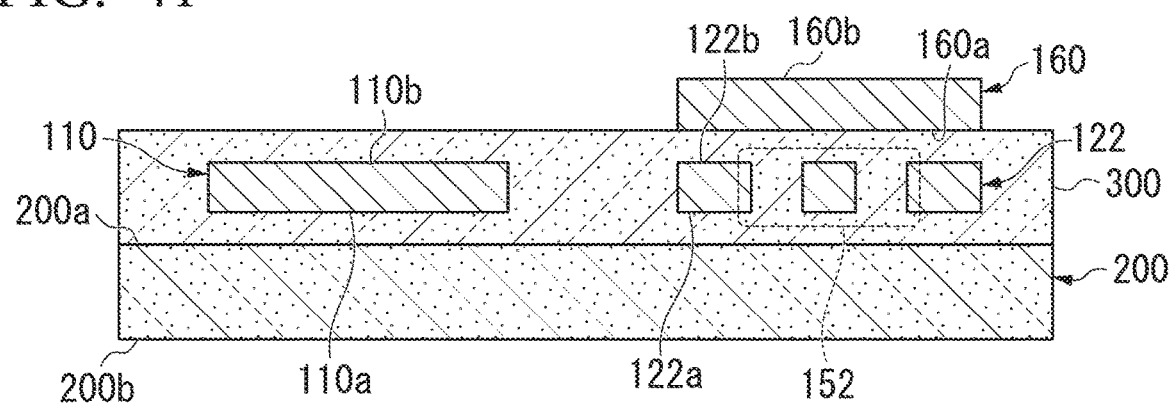
FIG. 41 is a cross-sectional view for describing a method for manufacturing the semiconductor device according to the second embodiment of the present invention.

As shown in FIG. 41, the resist film 360 is removed. In this way, the surface 160b of the metal film 160 is exposed.

Figure 42:
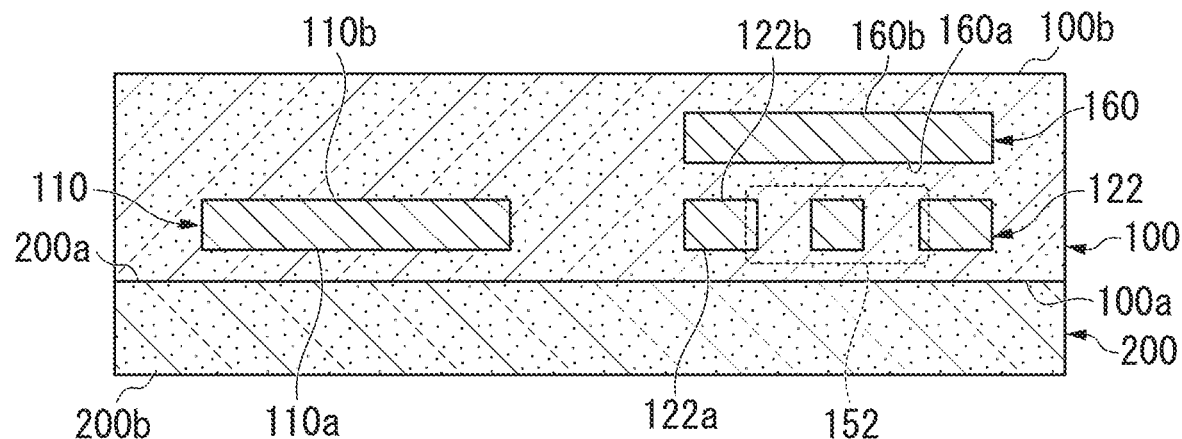
FIG. 42 is a cross-sectional view for describing a method for manufacturing the semiconductor device according to the second embodiment of the present invention.

As shown in FIG. 42, the same material as the material that forms the oxide film 300 is deposited to the surface of the oxide film 300 and the surface 160b of the metal film 160. In this way, the first semiconductor layer 100 is formed.

By the steps shown in FIGS. 8, 35, and 42, the first semiconductor layer 100 is stacked on the second semiconductor layer 200. After the step shown in FIG. 42 is performed, a supporting substrate or a semiconductor substrate may be stacked on the surface 100b of the first semiconductor layer 100.

Figure 43:
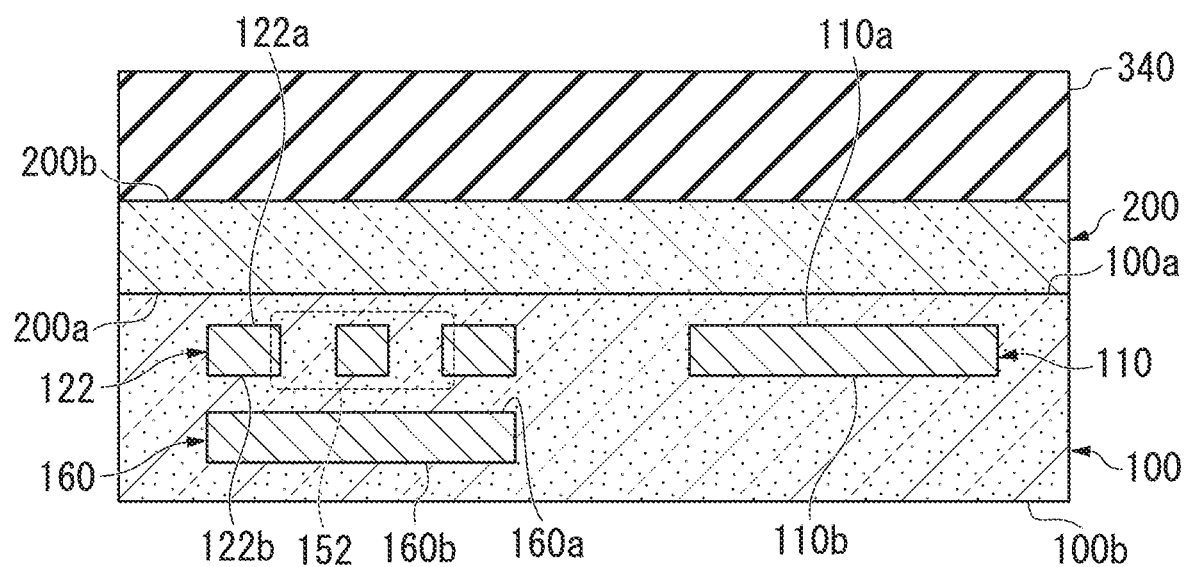
FIG. 43 is a cross-sectional view for describing a method for manufacturing the semiconductor device according to the second embodiment of the present invention.

As shown in FIG. 43, the resist film 340 is formed on the surface 200b of the second semiconductor layer 200. The surface 200b of the second semiconductor layer 200 is covered with the resist film 340. Since the second semiconductor layer 200 is thick, the resist film 340 is formed to be thick.

Figure 44:
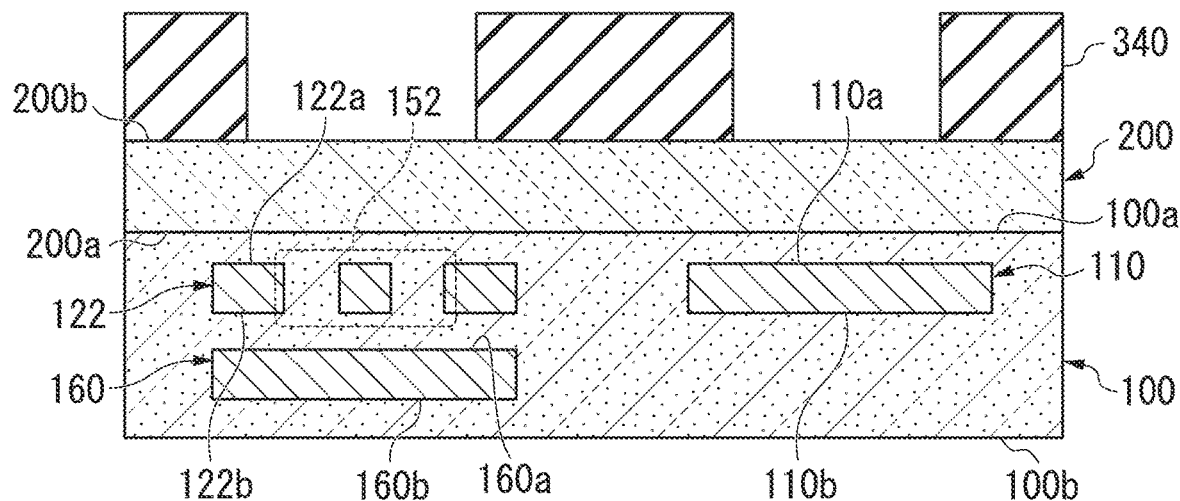
FIG. 44 is a cross-sectional view for describing a method for manufacturing the semiconductor device according to the second embodiment of the present invention.

As shown in FIG. 44, a pattern is formed on the resist film 340 by photolithography. In the resist film 340, the resist film 340 on the region in which the first, second, third, and fourth openings 130, 140, 210, and 220 are formed is removed.

Figure 45:
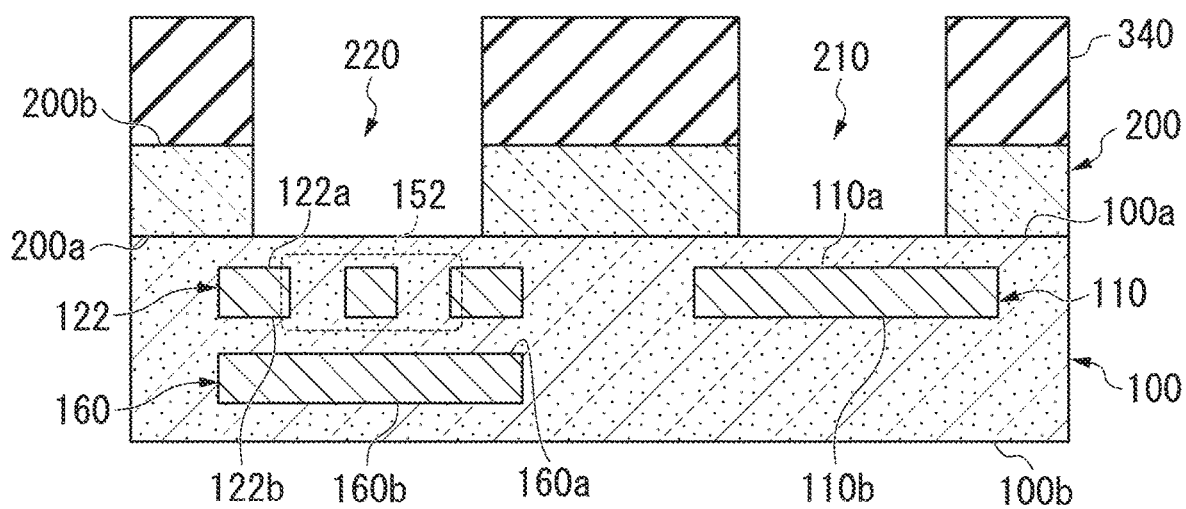
FIG. 45 is a cross-sectional view for describing a method for manufacturing the semiconductor device according to the second embodiment of the present invention.

As shown in FIG. 45, the second semiconductor layer 200 is etched. The resist film 340 functions as an etching mask. A portion of the second semiconductor layer 200 other than the portion covered with the resist film 340 is removed through etching of the second semiconductor layer 200. A portion of the surface of the first semiconductor layer 100 is exposed by etching the second semiconductor layer 200. In this way, the third and fourth openings 210 and 220 are formed.

Figure 46:
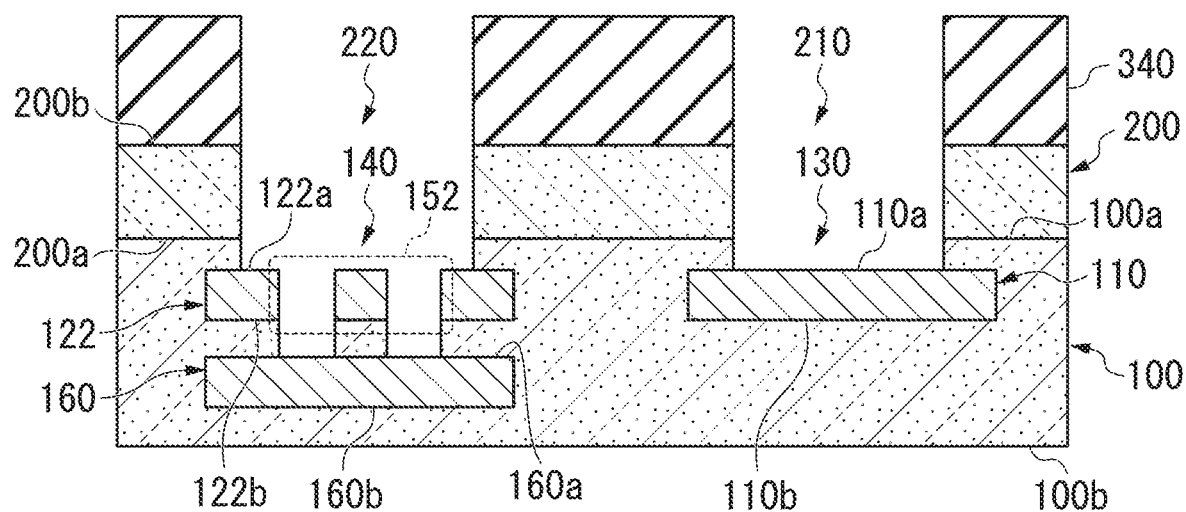
FIG. 46 is a cross-sectional view for describing a method for manufacturing the semiconductor device according to the second embodiment of the present invention.

As shown in FIG. 46, the first semiconductor layer 100 is etched. The resist film 340 functions as an etching mask. A portion of the first semiconductor layer 100 other than the portion covered with the second semiconductor layer 200 is removed through etching of the first semiconductor layer 100. The first and second pads 110 and 122 function as an etching stopper. The alignment mark 152 is a through-hole. Due to this, a portion corresponding to the alignment mark 152, of the first semiconductor layer 100 disposed between the second pad 122 and the metal film 160 is removed. The metal film 160 functions as an etching stopper. A portion of the surface of the first pad 110, the second pad 122, and the metal film 160 is exposed by etching the first semiconductor layer 100. In this way, the first and second openings 130 and 140 are formed.

After the step shown in FIG. 46 is performed, the resist film 340 is removed. In this way, as shown in FIG. 32, the surface 200b of the second semiconductor layer 200 is exposed.

Figure 47:
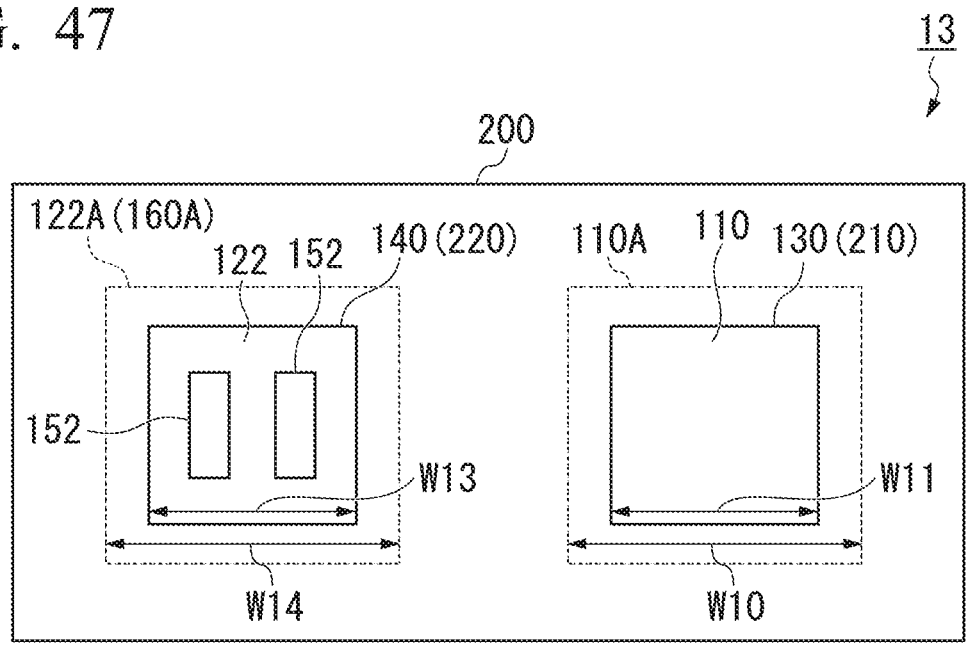
FIG. 47 is a plan view of the semiconductor device according to the second embodiment of the present invention.
Figure 48:
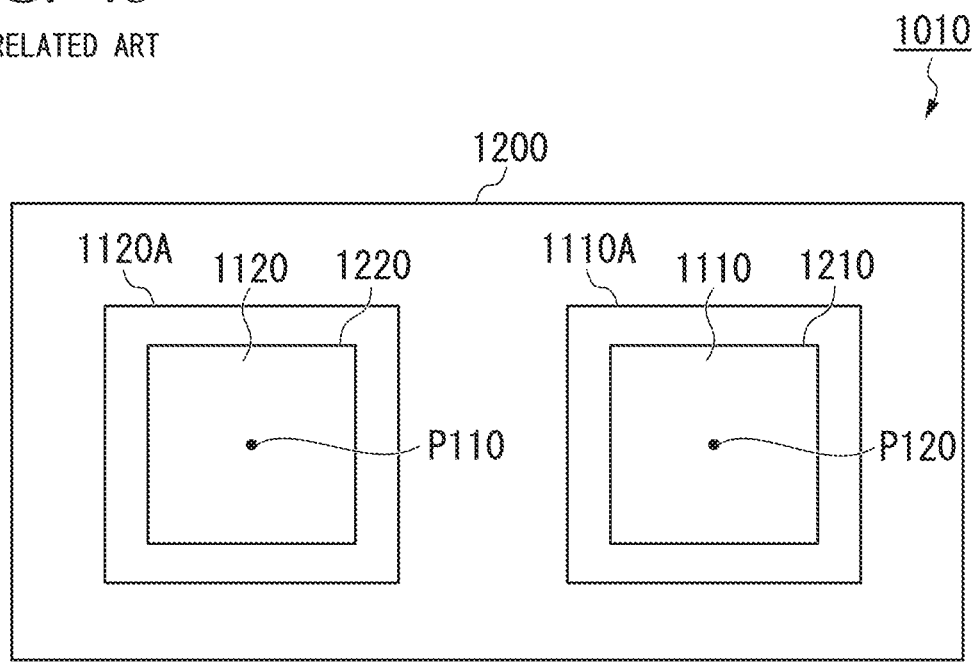
FIG. 48 is a plan view of a conventional monolithic semiconductor device.
Figure 49:
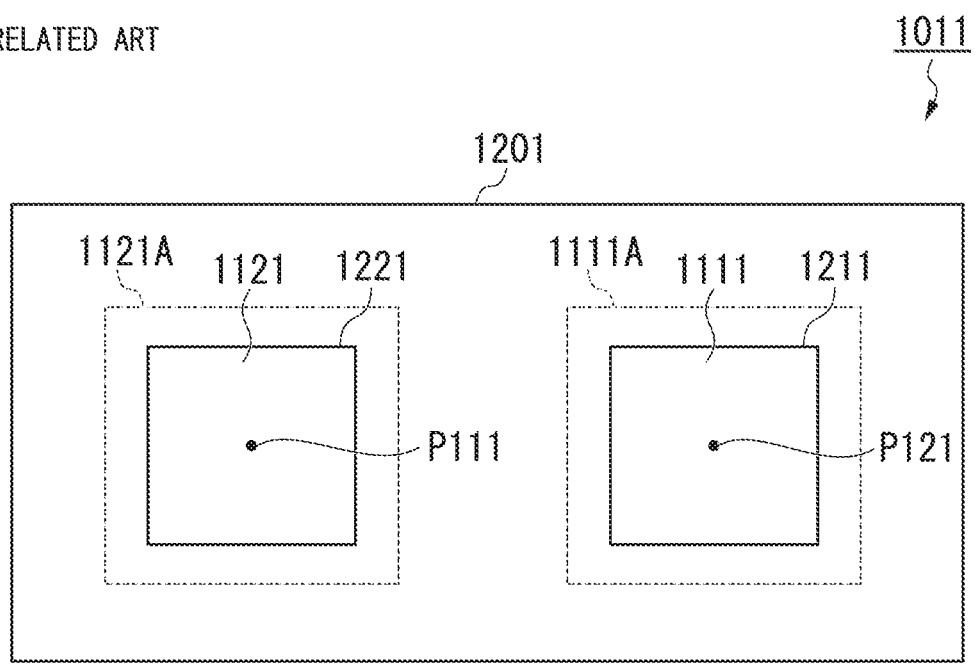
FIG. 49 is a plan view of a conventional stacked semiconductor device.

FIG. 47 is a plan view of the semiconductor device 13. In FIG. 47, an arrangement of respective components when the second semiconductor layer 200 is seen in a direction perpendicular to the surface 200b is shown. That is, in FIG. 47, an arrangement of respective components when the second semiconductor layer 200 is seen from the front of the second semiconductor layer 200 is shown. The differences between FIGS. 2 and 47 will be described.

The second pad 122 and the metal film 160 have a rectangular shape. These components may have shapes other than a rectangular shape. In FIG. 47, an outline 122A of the second pad 122 and an outline 160A of the metal film 160 are shown. The metal film 160 overlaps the second pad 122. A width W14 of the metal film 160 is larger than a width W13 of the second opening 140. Therefore, an area of the metal film 160 is larger than an area of the second opening 140. The configuration shown in FIG. 47 other than the above-described components is the same as the configuration shown in FIG. 2.

As described above, the semiconductor device 13 has a metal film 160. The second pad 122 is disposed between the second semiconductor layer 200 and the metal film 160.

A method for manufacturing the semiconductor device 13 has a fifth step (FIGS. 37 and 40) of forming the metal film 160 in the first semiconductor layer 100 in addition to the first to fourth steps described in the first embodiment. The fifth step need not be performed subsequently to the first to fourth steps. The order of performing the first to fifth steps is arbitrary.

In the semiconductor device 13 of the second embodiment, the second pad 122 having the surface 122a on which the alignment mark 152 is formed is disposed. Due to this, the alignment accuracy of wire bonding positions is improved.

In the semiconductor device 13 of the second embodiment, the metal film 160 is disposed. Since the alignment mark 152 is a through-hole, a portion of the first semiconductor layer 100 corresponding to the alignment mark 152 is etched. The metal film 160 functions as an etching stopper.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
    a first semiconductor layer having a first main surface in which a first opening and a second opening are formed;
    a second semiconductor layer having a second main surface in which a third opening and a fourth opening are formed and stacked on the first semiconductor layer;
    a first pad having a third main surface for wire bonding, the third main surface being disposed in the first opening; and
    a second pad having a fourth main surface on which an alignment mark is formed, the fourth main surface being disposed in the second opening,
    wherein the second main surface faces the first main surface,
    the third opening and the fourth opening penetrate the second semiconductor layer in a thickness direction of the second semiconductor layer,
    the first opening overlaps the third opening,
    the second opening overlaps the fourth opening,
    a width of the first pad in a second direction perpendicular to a first direction is larger than a width of the first opening in the second direction, a width of the second pad in the second direction is larger than a width of the second opening in the second direction, and the first direction is a thickness direction of the first semiconductor layer.

2. The semiconductor device according to claim 1, wherein the first pad and the second pad are formed of the same metal, and the alignment mark is a concave portion formed in the fourth main surface.

3. The semiconductor device according to claim 1, wherein the first pad and the second pad are formed of the same metal, and the alignment mark is a convex portion formed on the fourth main surface.

4. The semiconductor device according to claim 1, wherein the first pad and the second pad are formed of the same metal, and the alignment mark is a through-hole penetrating the second pad in the thickness direction.

5. The semiconductor device according to claim 4, further comprising:

a metal film, wherein the second pad is disposed between the second semiconductor layer and the metal film.

* * * * *